United States Patent
Taguchi et al.

[11] Patent Number: 6,043,725
[45] Date of Patent: Mar. 28, 2000

[54] FILTER CIRCUIT HAVING PLURAL PASSING BANDS

[75] Inventors: Yutaka Taguchi, Takatsuki; Kazuo Eda, Nara; Osamu Kawasaki, Kyotanabe; Shun-ichi Seki, Amagasaki; Keiji Onishi, Settsu; Hiroki Sato, Moriguchi, all of Japan

[73] Assignee: Matsushita Electric Industrial Co., Ltd., Osaka, Japan

[21] Appl. No.: 09/086,491

[22] Filed: May 29, 1998

[30] Foreign Application Priority Data

May 30, 1997 [JP] Japan ................................. 9-142648

[51] Int. Cl.[7] .............................. H03H 9/64; H01P 1/20; H01P 1/213
[52] U.S. Cl. ............................ 333/193; 333/167; 333/132
[58] Field of Search ............................ 333/126, 129, 333/132, 133, 193, 202, 167, 175

[56] References Cited

U.S. PATENT DOCUMENTS

| | | | |
|---|---|---|---|
| 5,015,973 | 5/1991 | Kawakami et al. | 333/202 X |
| 5,386,203 | 1/1995 | Ishihara | 333/129 |
| 5,515,015 | 5/1996 | Nakata | 333/193 X |
| 5,534,829 | 7/1996 | Kobayashi et al. | 333/126 |
| 5,815,052 | 9/1998 | Nakajima et al. | 333/175 |

FOREIGN PATENT DOCUMENTS

| | | | |
|---|---|---|---|
| 0 732 806 A2 | 9/1996 | European Pat. Off. . | |
| 196 33 954 A1 | 2/1997 | Germany . | |
| 3-220911 | 9/1991 | Japan | 333/193 |
| 4-16014 | 1/1992 | Japan | 333/133 |
| 4-253414 | 9/1992 | Japan | 333/133 |
| 5-152881 | 6/1993 | Japan | 333/193 |
| 5-167388 | 7/1993 | Japan . | |
| 5-235688 | 9/1993 | Japan | 333/193 |
| 6-6170 | 1/1994 | Japan | 333/193 |
| 9-98046 | 4/1997 | Japan . | |
| 9-121138 | 5/1997 | Japan . | |
| 9-252232 | 9/1997 | Japan . | |

OTHER PUBLICATIONS

Patent Abstracts of Japan, vol. 95, No. 5, English–language Abstract of Japanese Patent Publication No. 07038376, to Hitachi Ltd., published Feb. 7, 1995.

*Primary Examiner*—Robert Pascal
*Assistant Examiner*—Barbara Summons
*Attorney, Agent, or Firm*—Smith, Gambrell & Russell, LLP

[57] ABSTRACT

The filter circuit is a filter circuit having plural passbands including a first filter having a first passband, and a second filter having a second passband, with their inputs and outputs connected mutually so that these filters are connected in parallel. Inductor elements are connected in series to the terminal of the first filter to which the second filter is connected, and capacitor elements are connected in series to the terminal of the second filter to which the first filter is connected.

28 Claims, 24 Drawing Sheets

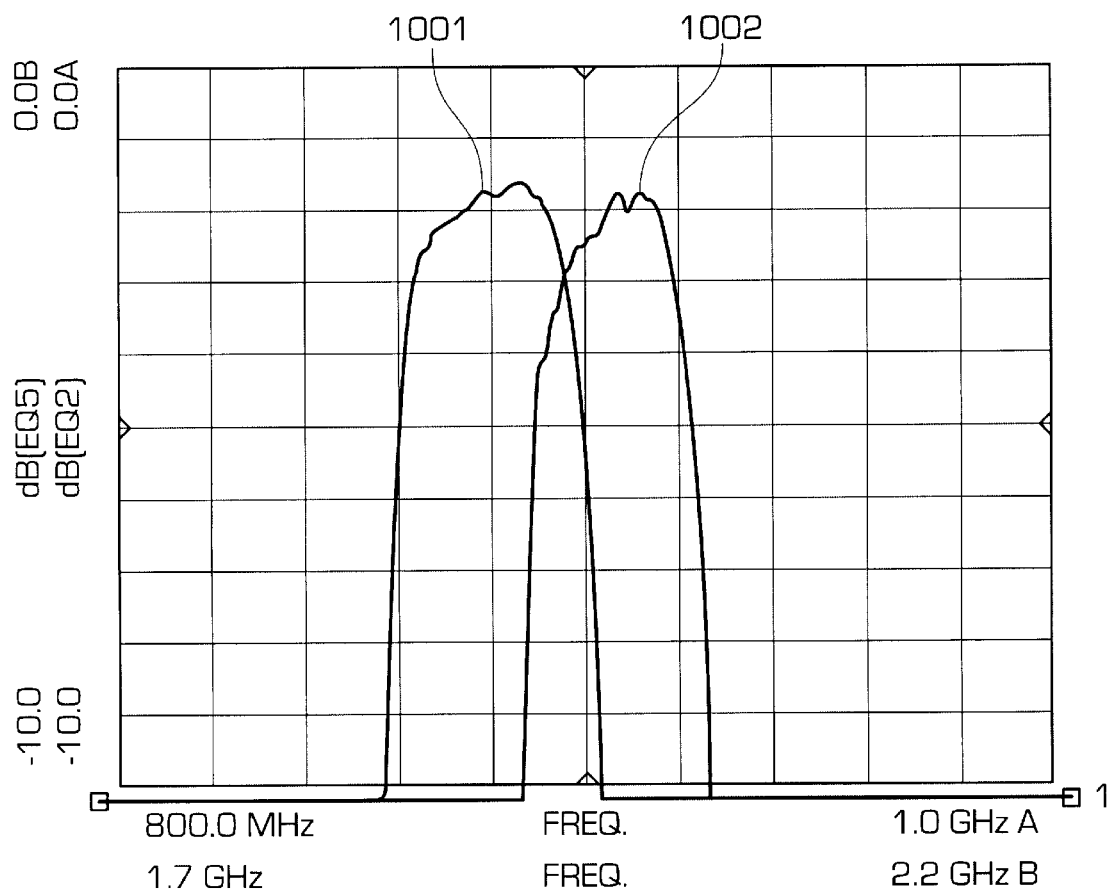

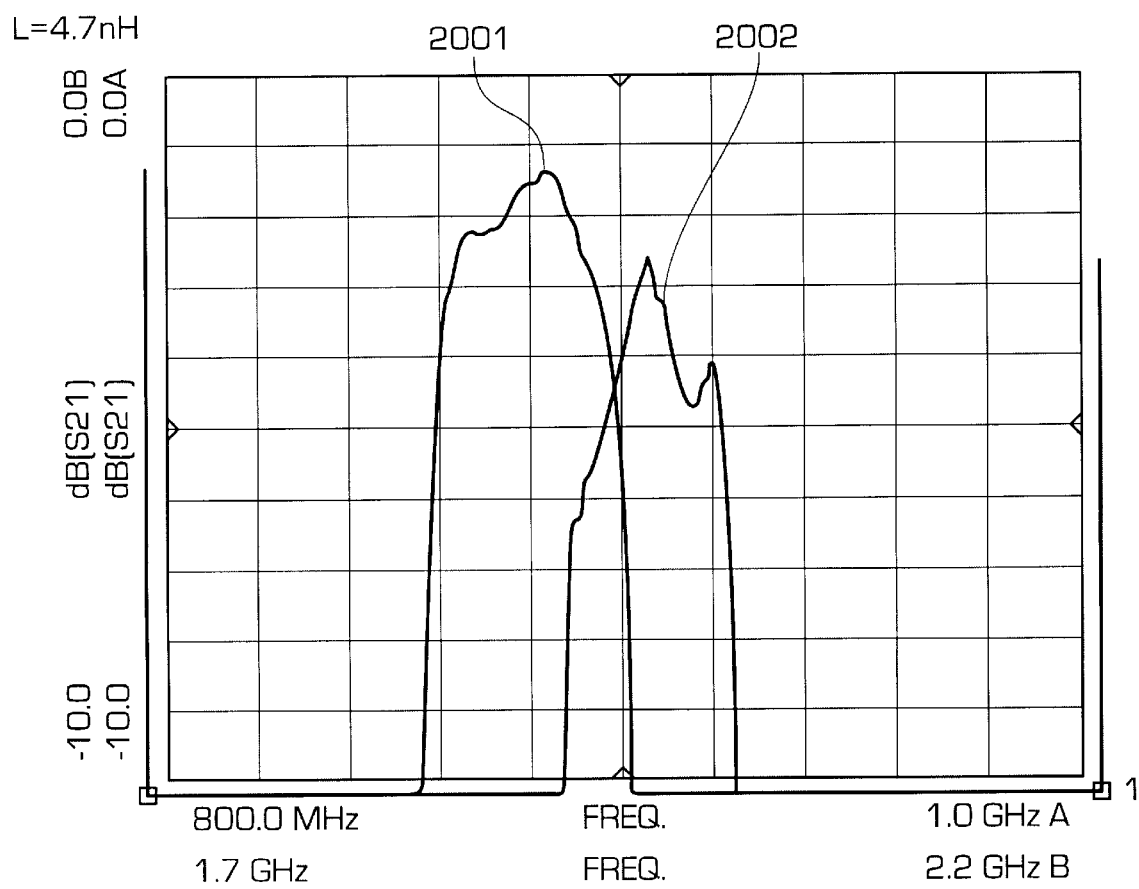

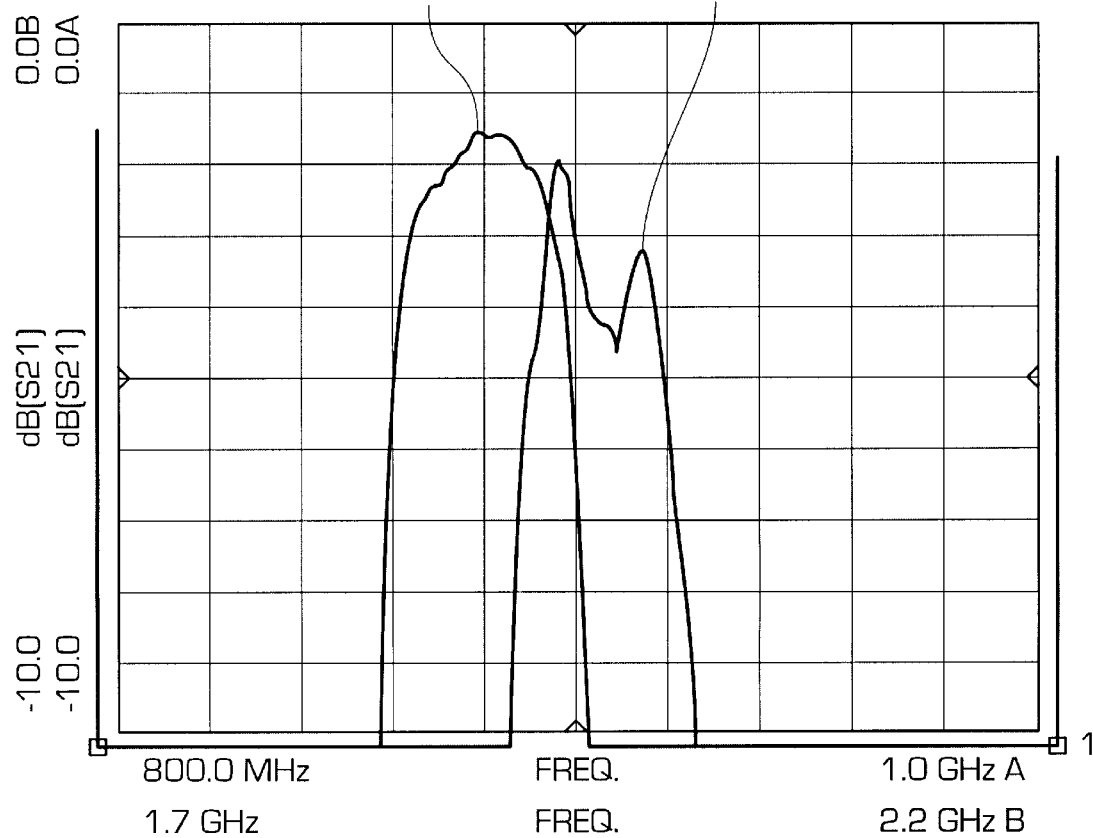

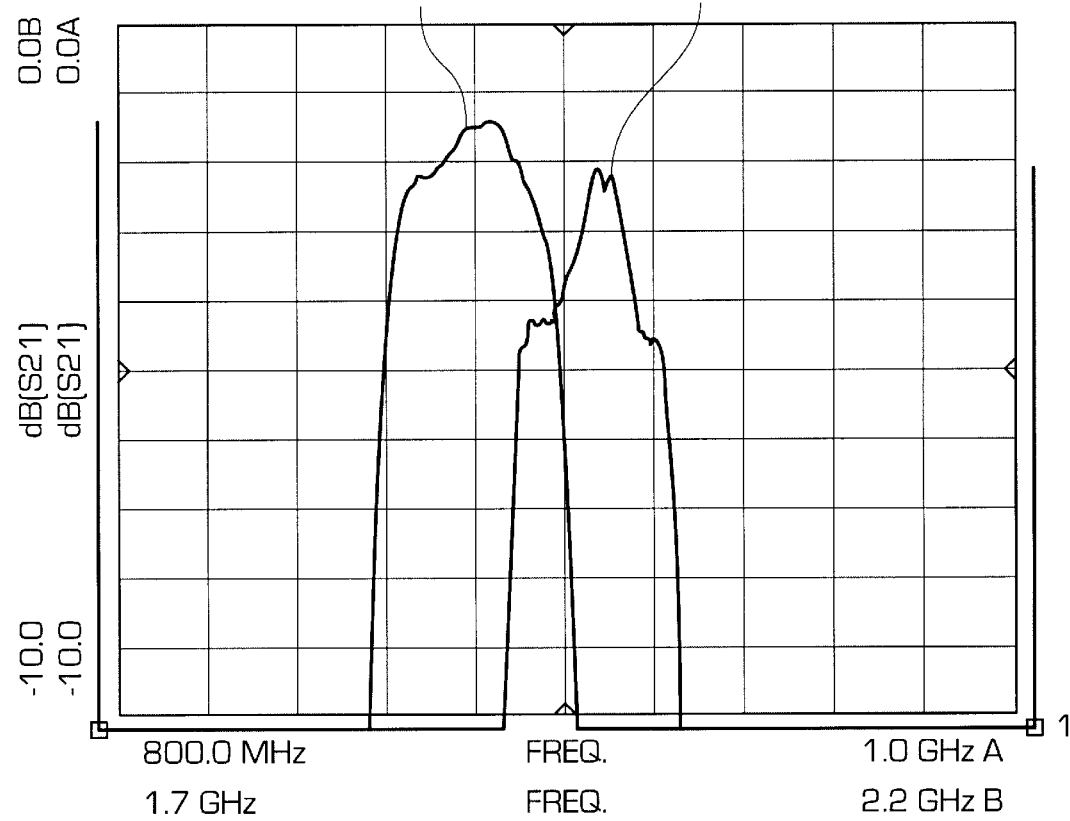

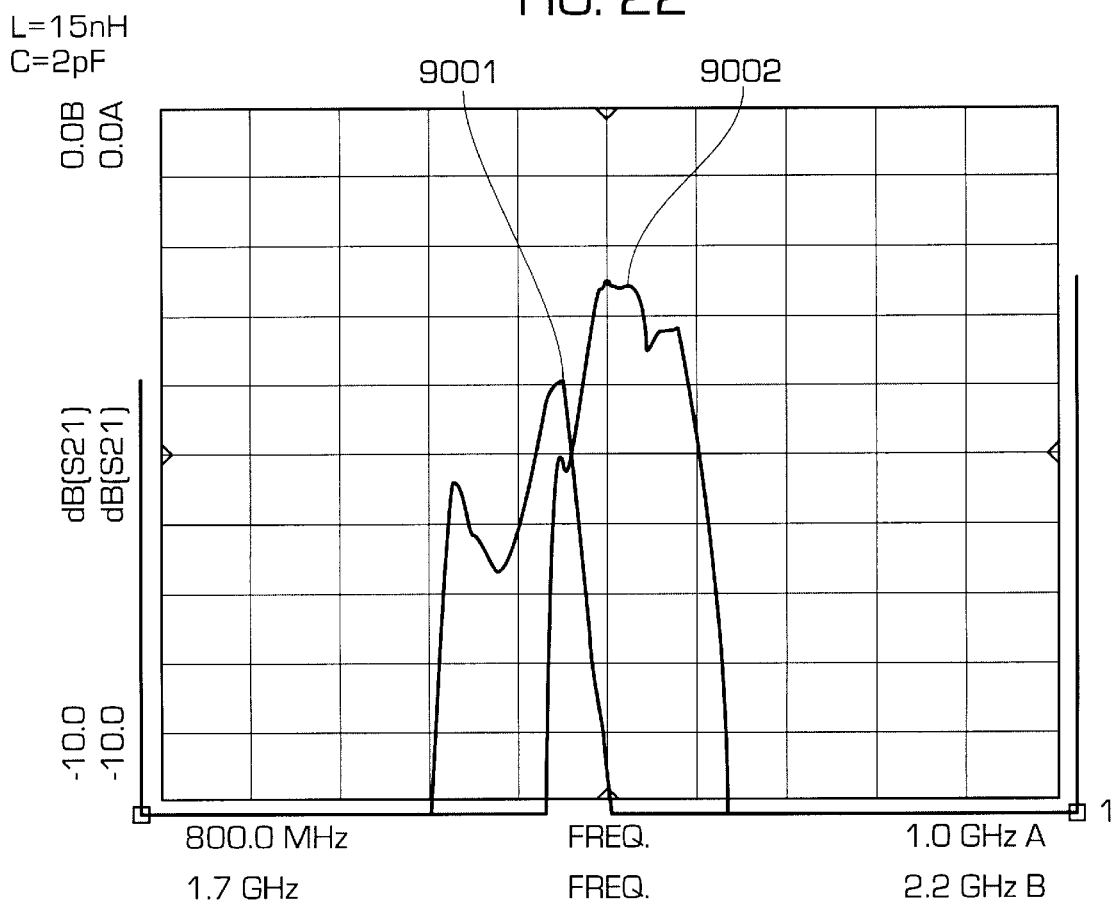

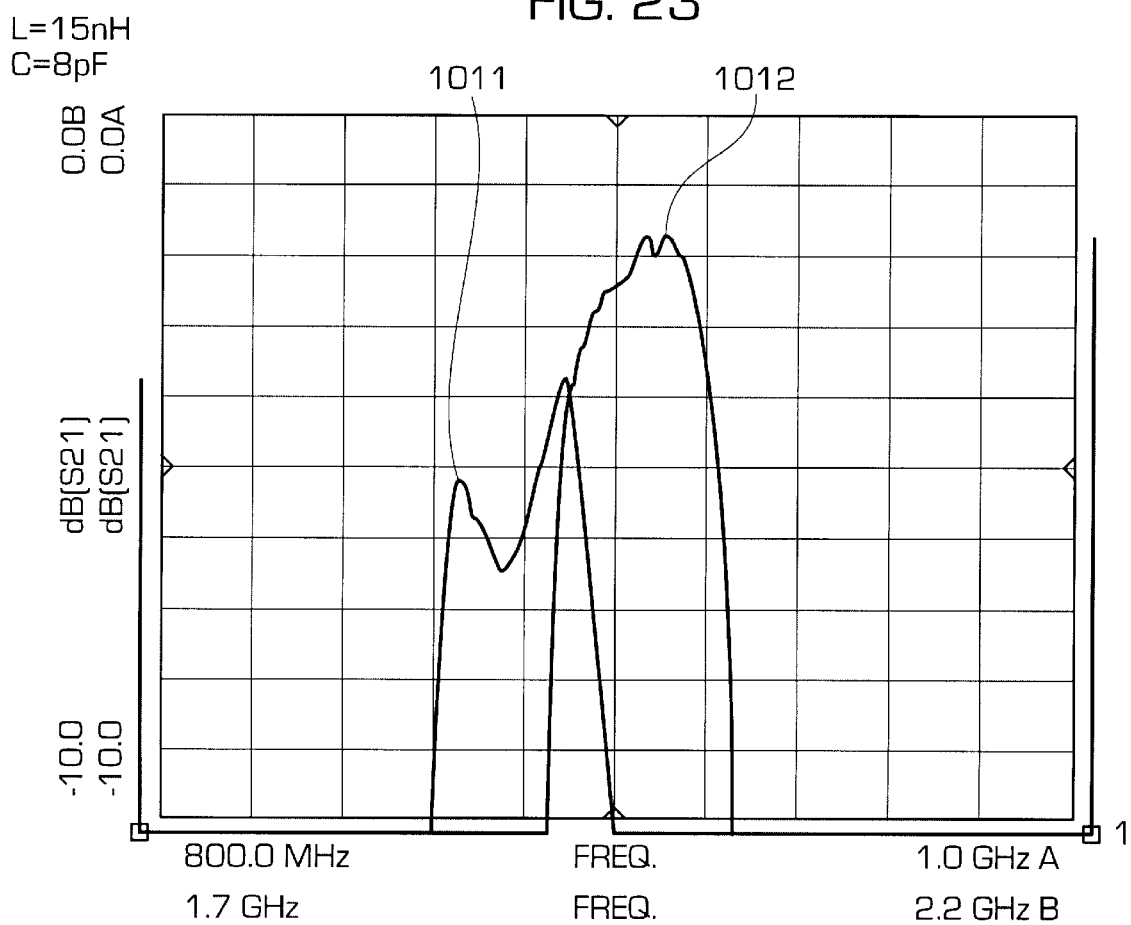

FILTER CIRCUIT HAVING PLURAL PASSING BANDS

BACKGROUND OF THE INVENTION

1. Field of the Invention

The present invention relates to a filter circuit having plural passbands.

2. Related Art of the Invention

The surface acoustic wave filter has come to be used in various appliances and, in particular, mobile communication devices owing to its features of small size and high performance. Characteristics of filters have been widely investigated, but mainly filters having a single passband have been studied, and little has been studied about filters having multiple passbands.

For example, what is disclosed in Japanese Laid-open Patent No. 5-167388 is a branching filter making use of surface acoustic waves. Japanese Laid-open Patent No. 9-98046 discloses a branching filter in which a circuit connecting a low pass filter is explained in the connection part of each filter. In Japanese Laid-open Patent No. 9-121138, similarly, a circuit used in a branching filter is described.

Recently, owing to advancement in mobile communications, the service frequency band is raised to the region of quasi-microwaves. As mobile communication is further distributed, the service frequencies tend to extend.

However, the use of the conventional system cannot be stopped, and therefore the coexistence of two systems is required. For this purpose, for transmission and reception, at least two or more frequencies must be used. In this case, a filter, reception amplifier and transmission amplifier are required for each frequency. That is, two sets of each are needed in this case, and the circuit scale is thereby increased.

As a circuit corresponding to both frequencies, for example, if the reception amplifier is used commonly, separate filters are needed for individual frequencies. In such a case, with changing over these filters by a switch using a semiconductor element, either appropriate filter can be used.

Also in this case, a power source circuit is needed for the semiconductor element, and the circuit scale is increased, too.

In the method explained in Japanese Laid-open Patent No. 5-167388, at a one-sided filter, an inductor or phase rotation line is inserted between the signal line and the ground, or a capacitor is inserted in series into the one-sided filter. In Japanese Laid-open Patent No. 9-98046, a circuit connecting a low pass filter in the connection part of each filter is disclosed. In Japanese Laid-open Patent No. 9-121138, a branching filter adding a phase adjusting circuit is disclosed.

In any case, however, since a circuit element lower in Q than the surface acoustic wave resonator is used, it finally leads to increase of insertion loss of the filter. Incidentally, the transmission line used as the phase adjusting circuit is extended in length depending on the frequency, and the merit of downsizing is decreased.

Needless to say, the above characteristic required in the branching filter is, in short, how to connect both filters without mutual interference of the characteristics of the individual filters. In such a branching filter, incidentally, taking note of one arbitrary filter out of the two filters to be connected, at the passing frequency of that filter, the impedance of the other filter is infinite. Thus conventional filter investigation is made from only one viewpoint of how to design so that the impedance of the other filter at the passing frequency may not contain the inductance components or capacity components.

However, the inventor of the present application, not sticking to the conventional fixed idea, discovered that the number of elements for matching can be decreased by designing from a different point of view.

That is, the new point of view of the inventor of the present application is to connect the circuit by allowing it to contain the inductance components or capacitive components in the impedance of one filter at the passing frequency of this filter. At this time, for this filter, at its passing frequency, the impedance of the other filter is a certain large value, but it is not infinite as in the case of the prior art method. Accordingly, regarding the other filter as a circuit element having the above impedance connected to one filter, a matching element is connected to the other filter, so that the effect of this circuit element can be substantially ignored. By adjusting the value of this matching element, the inductance components or capacitive components considered to be effects of the circuit element can be decreased or removed. Hence, while maintaining the same performance as in the prior art, the number of matching elements can be curtailed consequently. The inventor of the present applicant also discovered that it is sometimes not necessary to connect the matching element to the other filter as mentioned above, if the value of the component is an ignorable level, after connecting by allowing to contain the inductance components or capacity components.

In consideration of such problems in connection between conventional filters, it is an object of the invention to realize a filter circuit having plural passbands by the constitution further curtailing the number of matching elements.

SUMMARY OF THE INVENTION

A filter circuit having plural passbands of the first embodiment of the invention comprises:

a first filter having a first passband, and a second filter having a second passband, with at least one of their input terminals and output terminals connected mutually in parallel, wherein the second filter has the higher passing frequency than the first filter, and an inductor element is connected in series to at least one terminal of the first filter, said terminal being connected to the terminal of the second filter.

A filter circuit having plural passbands of the second embodiment of the invention further comprises a capacitor element connected in series to at least of one terminal of the second filter, said terminal being connected to the terminal of the first filter.

The present invention according to said first or second embodiment is a filter circuit having plural passbands, wherein the input and output impedance of the first filter alone and/or the input and output impedance of the second filter alone is lower than the input and output impedance required in the filter circuit.

BRIEF DESCRIPTION OF THE DRAWINGS

FIG. 9 is a partially magnified view of each passband when the filters 401, 402 shown in the embodiment are measured alone.

FIG. 10 is a partially magnified view of each passband when setting the value of 4.7 nH for the inductor elements 403-1, 403-2, in the filter circuit shown in FIG. 5(a) of the embodiment.

FIG. 20 is a partially magnified view of each passband when setting the value of 4.7 nH for the inductor elements 703-1, 703-2, and 2 pF for the capacitor elements 704-1, 704-2, in the filter circuit shown in FIG. 16 of the embodiment.

FIG. 21 is a partially magnified view of each passband when setting the value of 4.7 nH for the inductor element, and 8 pF for the capacitor element, in the filter circuit shown in FIG. 16 of the embodiment.

FIG. 22 is a partially magnified view of each passband when setting the value of 15 nH for the inductor element, and 2 pF for the capacitor element, in the filter circuit shown in FIG. 16 of the embodiment.

FIG. 23 is a partially magnified view of each passband when setting the value of 15 nH for the inductor element, and 8 pF for the capacitor element, in the filter circuit shown in FIG. 16 of the embodiment.

Reference Numerals

Figure 1:
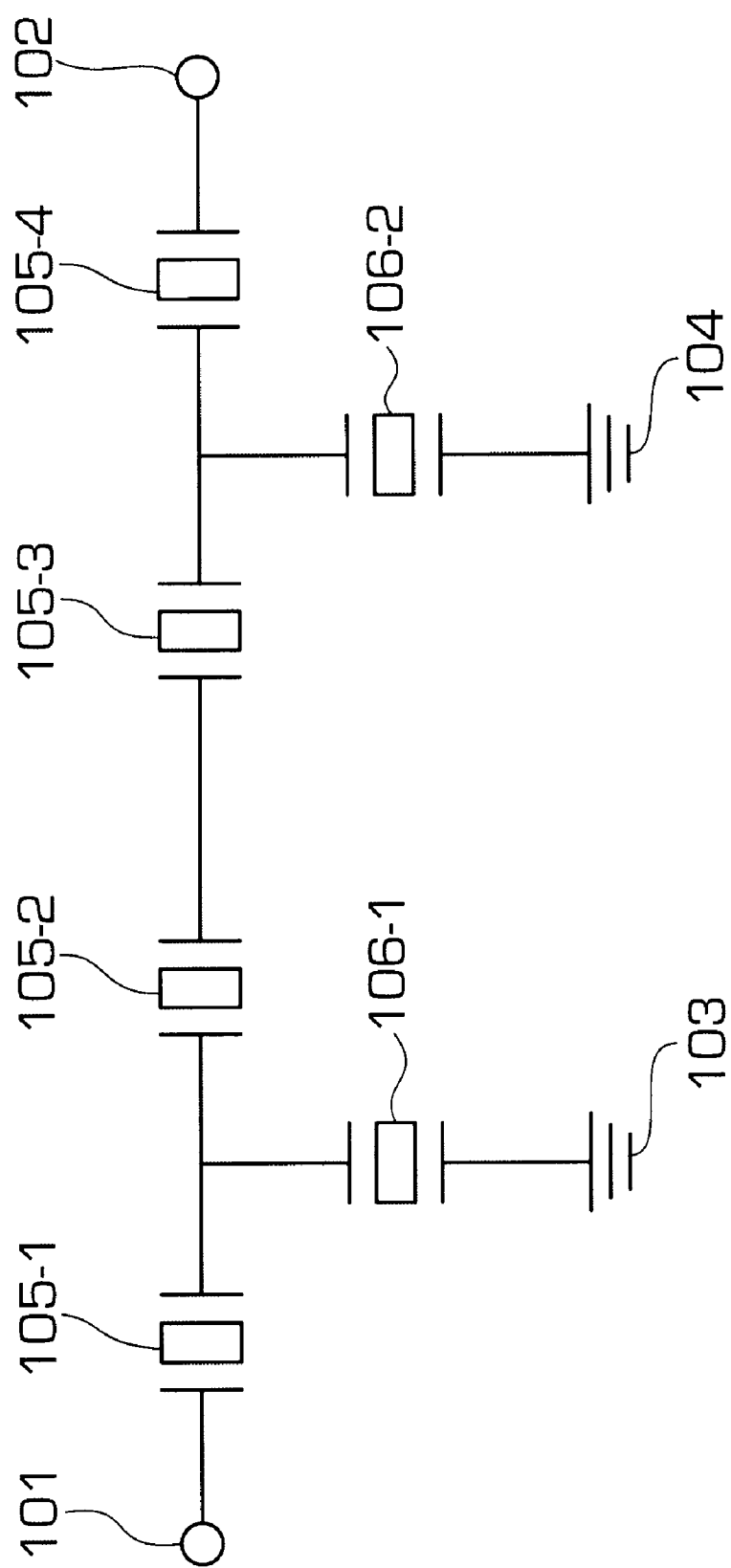
FIG. 1 is a block diagram of a ladder type filter used in a filter circuit in an embodiment of the invention.

| | |
|---|---|
| 105-1 to 105-4 | Surface acoustic wave resonator |
| 401 | 800 MHz band filter |
| 402 | 1.8 GHz band filter |
| 403-1, 403-2 | Inductor element |
| 404 | Input terminal |
| 405 | Output terminal |
| 704-1, 704-2 | Capacity element |

DESCRIPTION OF THE PREFERRED EMBODIMENTS

Referring now to the drawings, preferred embodiments of the invention are described in detail below.

(Embodiment 1)

Herein, an embodiment of a filter circuit having plural passbands according to the invention is described while referring to the drawings.

Figure 5A:
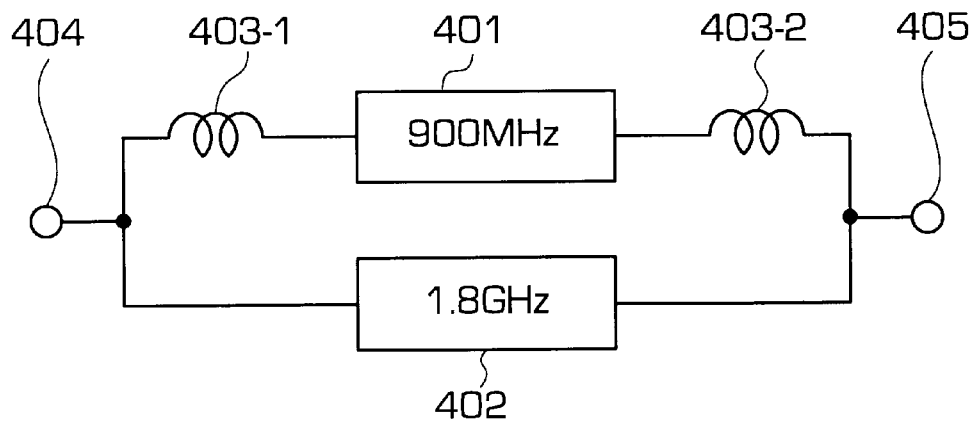
FIG. 5(a) is a diagram showing a filter circuit formed by parallel connection of a first filter and a second filter in embodiment 1.

FIG. 5(a) is a circuit diagram showing an embodiment of a filter circuit having plural passbands according to the invention. FIG. 1 is a block diagram the first or second filter used in the filter circuit in FIG. 5(a).

In this embodiment, as the first filter F1, a ladder type filter using a surface acoustic wave resonator as shown in FIG. 1 was used. The center frequency of the first filter is 900 MHz. As the second filter F2, a ladder type filter of the same constitution as shown in FIG. 1 was used. The center frequency of the second filter is 1.8 GHz. Herein, the constitution of the ladder type filter shown in FIG. 1 is briefly described. In the diagram, reference numerals 101, 102 are input and output terminals, and 103, 104 are grounds. Reference numerals 105-1, 105-2, 105-3, 105-4 are surface acoustic wave resonators connected in series to signal lines, and 106-1, 106-2 are surface acoustic wave resonators connected between the signal lines and grounds.

First is described the relation of input and output impedance of the first and second filters.

Figure 2:
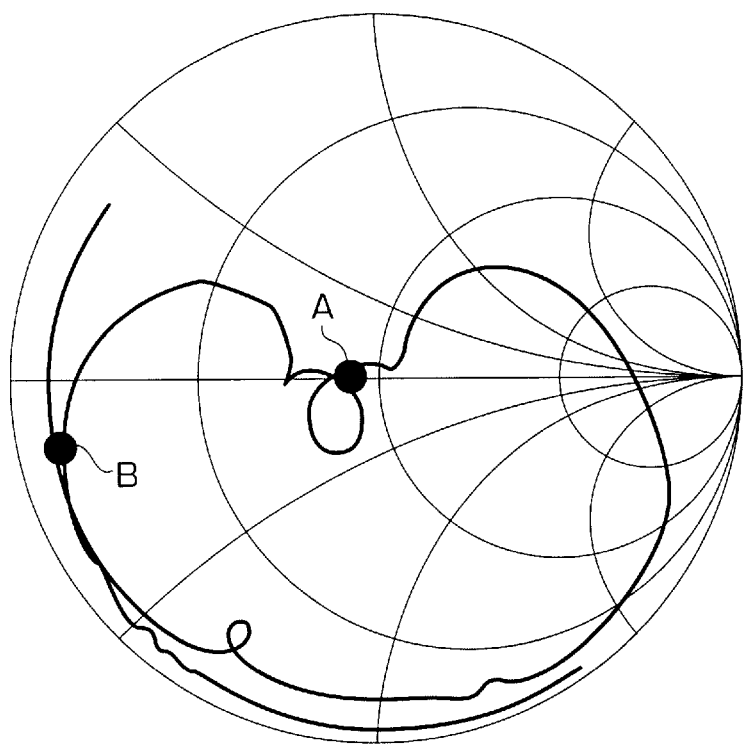
FIG. 2 is a Smith chart showing the input impedance of a 900 MHz band filter in the embodiment.

FIG. 2 is a Smith chart showing the impedance of the 900 MHz band filter (first filter F1).

In the diagram, point A is the impedance of the passband of 900 MHz, and point B is the impedance at 1.8 GHz.

Figure 3:
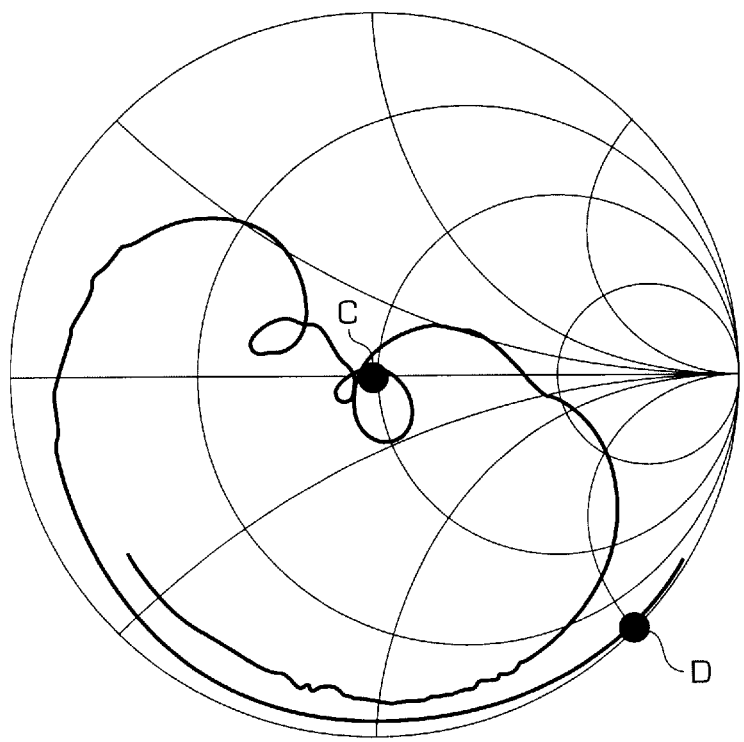
FIG. 3 is a Smith chart showing the input impedance of a 1.8 GHz band filter in the embodiment.

FIG. 3 is a Smith chart showing the impedance of the 1.8 GHz band filter (second filter F2).

In the diagram, point C is the impedance of the passband of 1.8 GHz, and point D is the impedance at 900 MHz.

Figure 4A:
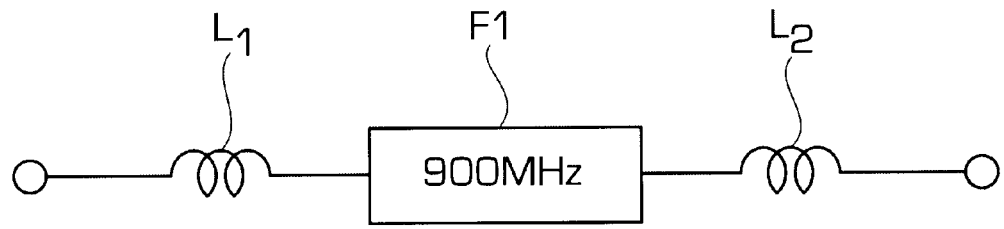
FIG. 4(*a*) is a circuit diagram of a series connection of inductors L1, L2 to a 900 MHz band filter F1 in the embodiment.
FIG. 4(b) is a diagram showing impedance changes of the circuit shown in FIG. 4(a).

Next are analyzed the impedance changes when the inductors L1, L2 are connected in series to the filter F1 of 900 MHz, as shown in FIG. 4(a).

Figure 4B:
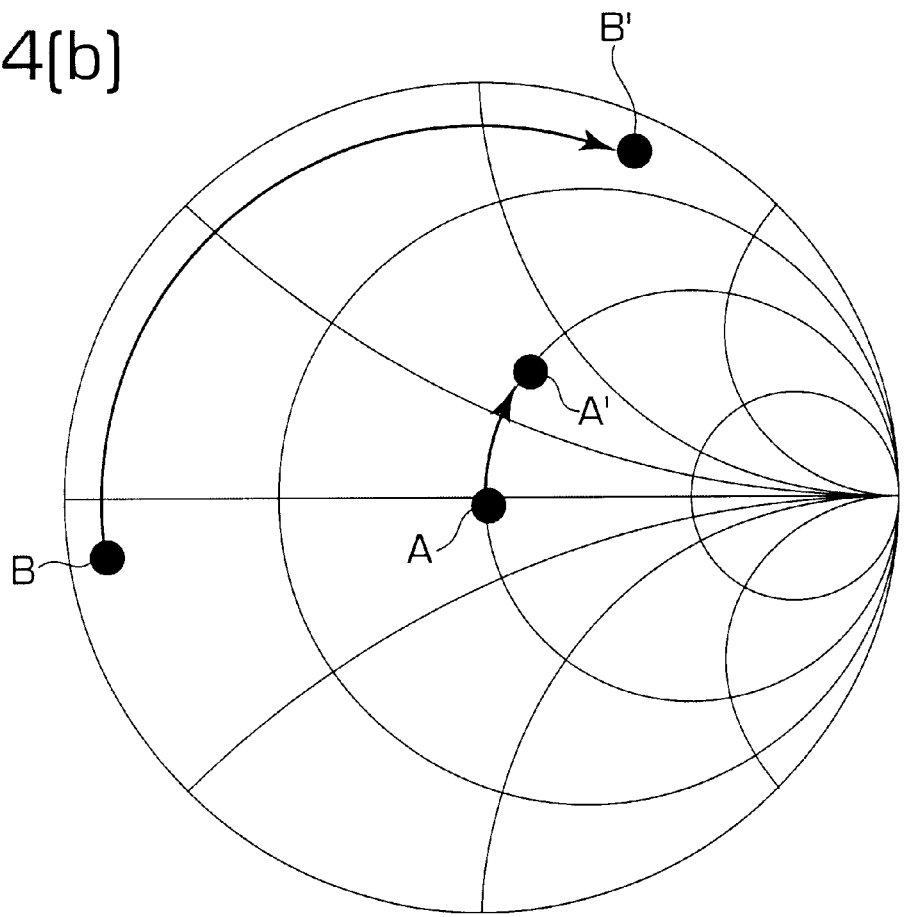

In this case, the impedance at 900 MHz in the passband of the filter F1 is moved from point A to point A' as shown in FIG. 4(b), and the impedance at 1.8 GHz is moved from point B to point B'. Herein, point A and point B are the impedance points shown in FIG. 2.

Figure 5B:
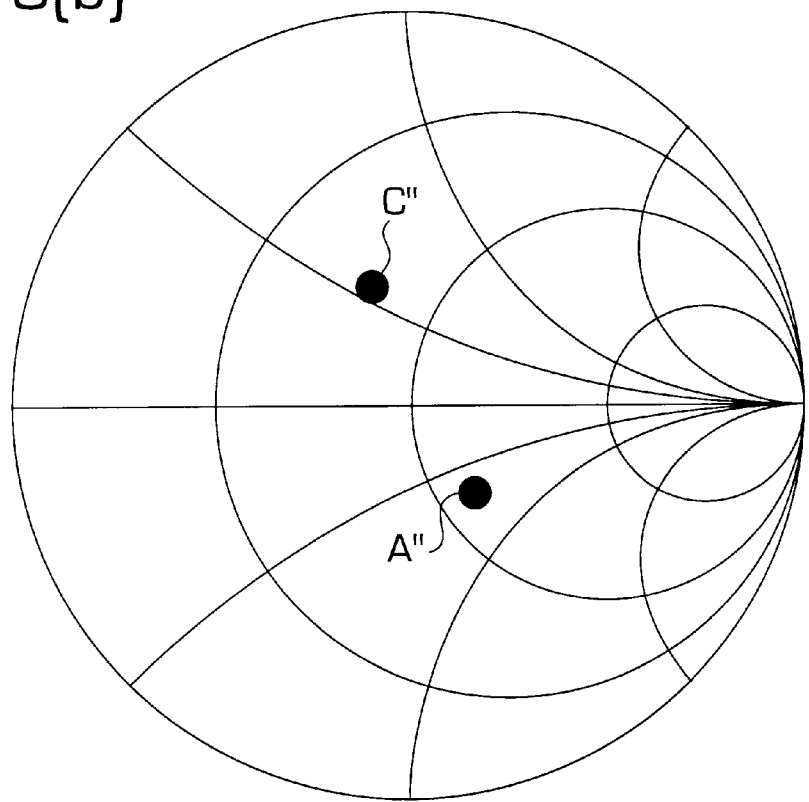
FIG. 5(b) is a diagram showing an impedance at the center frequency of each passband of filters F1, F2 in the filter circuit shown in FIG. 5(a).

Referring then to FIG. 5(a) to FIG. 8(b), impedance changes shown in FIG. 5(b) are analyzed. FIG. 5(a) is a circuit diagram showing the connecting of the filter F2 parallel to the circuit shown in FIG. 4(a). FIG. 5(b) is a diagram showing the impedance at the center frequency of each passband of the filters F1, F2 in the filter circuit shown in FIG. 5(a).

In FIG. 5(a), reference numeral 401 is a 900 MHz band filter F1, 402 is a 1.8 GHz band filter F2, 403-1, 403-2 are inductor terminals L1, L2, respectively, 404 is an input terminal, and 405 is an output terminal.

Figure 6A:
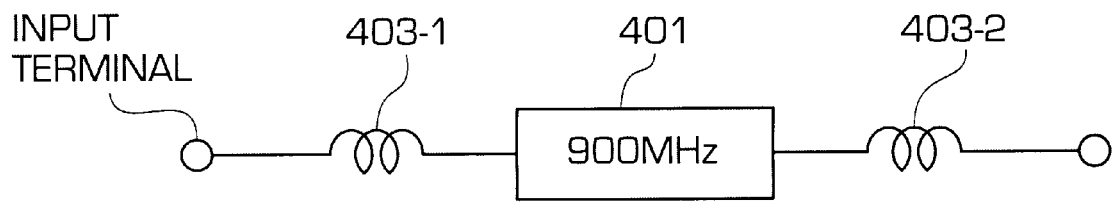
FIG. 6(a) is a circuit diagram showing a 900 MHz band filter 401 to which inductors L1, L2 are connected in FIG. 5(a).
Figure 6B:
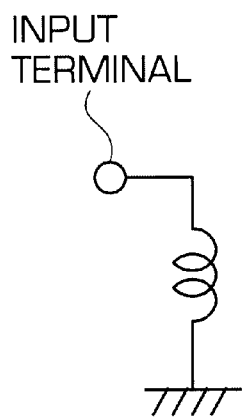
FIG. 6(b) is an equivalent circuit diagram in the 1.8 GHz band as seen from the input end of the circuit shown in FIG. 6(a).
Figure 7A:
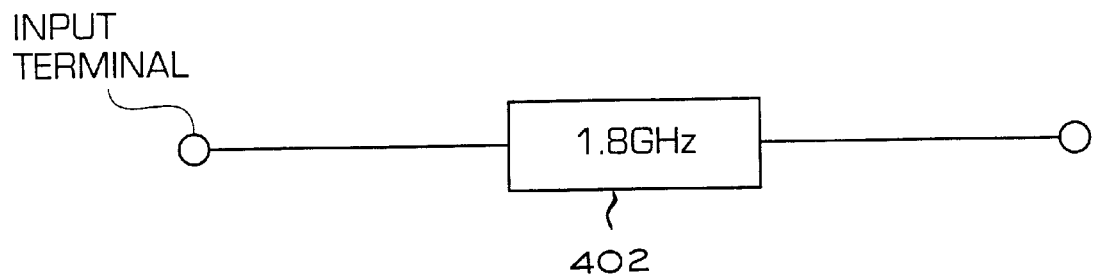
FIG. 7(a) is a circuit diagram showing a 1.8 GHz band filter 402 alone.
Figure 7B:
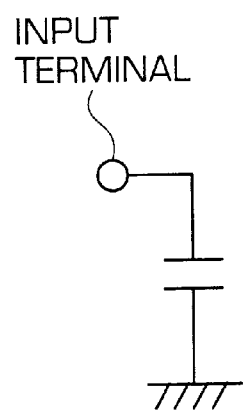
FIG. 7(b) is an equivalent circuit diagram in the 900 MHz band as seen from the input end of the circuit shown in FIG. 7(a).

In FIG. 5(a), the equivalent circuit in the 1.8 GHz band as seen from the input end of the 900 MHz band filter 401 (see FIG. 6(a)) to which the inductors L1, L2 are connected may be considered as shown in FIG. 6(b). Similarly, the equivalent circuit in the 900 MHz band as seen from the input end of the 1.8 GHz band filter 402 (see FIG. 7(a)) alone may be considered as shown in FIG. 7(b).

The reason for such consideration is described below.

The impedance out of the passband of each filter is expressed as in point B in FIG. 2 in the case of 900 MHz band filter 401, and as in point D in FIG. 3 in the case of 1.8 GHz band filter 402. Point B in FIG. 2 is moved to point B' by inserting inductors 403-1, 403-2 in series into the 900 MHz band filter 401. Herein, if it is attempted to replace this impedance of the 900 MHz band filter 401 with an equivalent circuit, as mentioned above, because the signal does not pass in the 1.8 GHz band, the input end and output end may be considered not to be connected, and the circuit having the impedance as indicated by point B' may be assumed. Therefore, this equivalent circuit may be expressed as in FIG. 6(b).

Likewise, in the 1.8 GHz filter 402, because the signal does not pass in the 900 MHz band, the input end and output end may be considered not to be connected, and the circuit having the impedance as indicated by point D may be assumed. Therefore, this equivalent circuit may be expressed as in FIG. 7(b).

Figure 8A:
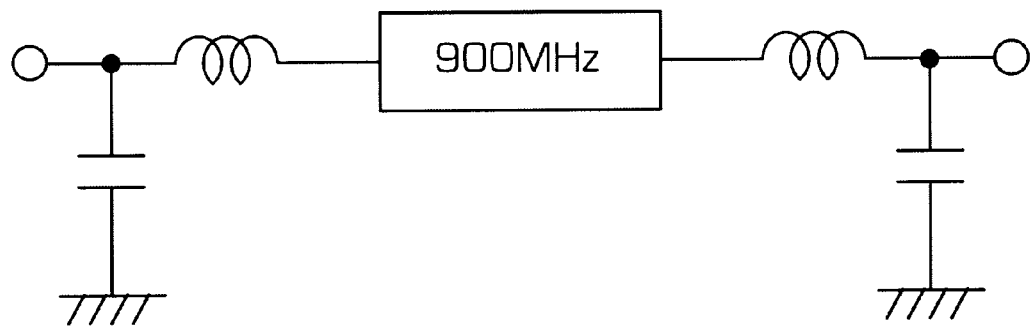
FIG. 8(a) is an equivalent circuit diagram in the 900 MHz band of the filter circuit shown in FIG. 5(a).
Figure 8B:
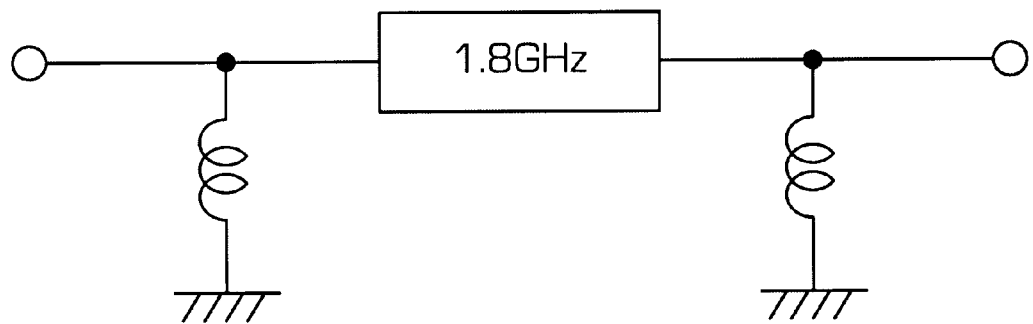
FIG. 8(b) is an equivalent circuit diagram in the 1.8 GHz band of the filter circuit shown in FIG. 5(a).

Hence, the equivalent circuits in the 900 MHz band and the 1.8 GHz band in the filter circuit shown in FIG. 5(a) respectively are as shown in FIG. 8(a) and FIG. 8(b).

Considered in this way, in the circuit shown in FIG. 5(a), supposing a measurement is made from its input end 404 toward the direction of the output end 405, the impedances at 900 MHz and 1.8 GHz should be respectively point A" and point C". Herein, as a result of actual measurement of the impedance of this circuit, the same result as shown in FIG. 5(b) was obtained. Thus, the correctness of considering in this way was confirmed.

Therefore, in the filter circuit shown in FIG. 5(a), as understood from the diagram in FIG. 5(b) (see point A" in the diagram), the circuit is constituted to allow the impedance of the filter 401 to include the capacitive component at the passing center frequency 900 MHz of the filter 401. Similarly, in the filter circuit shown in FIG. 5(a), the impedance of the filter 402 at the passing center frequency 1.8 GHz of the filter 402 includes the inductance component.

Preferably, the inductance component and capacitive component should be as small as possible. Accordingly, the values of inductor elements 403-1, 403-2 usable in this circuit constitution were specifically investigated. As a result, appropriate values were found to be in a range of 4.7 nH to 15 nH.

First, as inductor values of the inductor elements 403-1, 403-2 shown in FIG. 5(a), three values were set, that is, 4.7 nH, 8.2 nH, and 15 nH. In each set value, the characteristics of the passband of both filters 401, 402 in the circuit constitution in FIG. 5(a) were investigated. Results are shown in partially magnified views in FIGS. 10 to 12. Incidentally, FIG. 9 is a partially magnified view of each passband by measuring the filters 401, 402 independently, not in the state of circuit constitution shown in FIG. 5(a). In each diagram, reference numerals 1001, 2001, 3001, 4001 are characteristic diagrams of the 900 MHz band of the filter 401, and 1002, 2002, 3002, 4002 are characteristic diagrams of the 1.8 GHz band of the filter 402.

Figure 11:
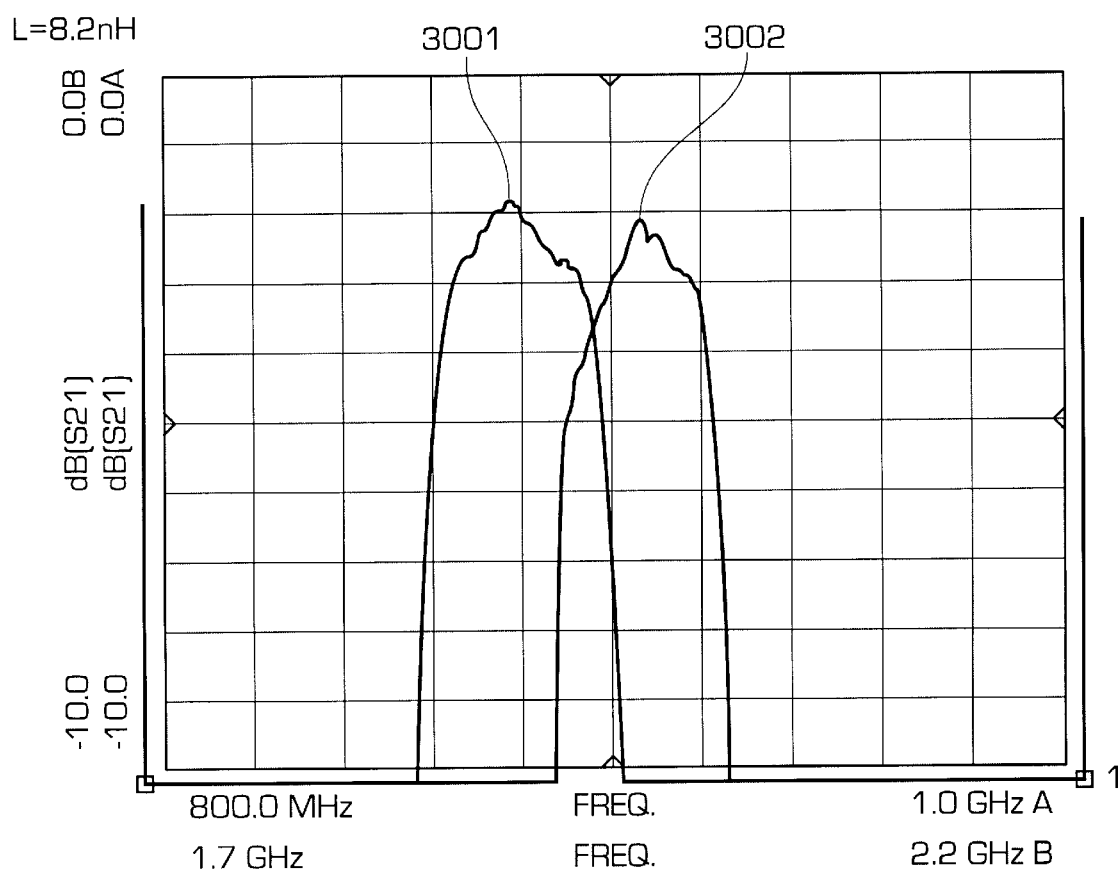
FIG. 11 is a partially magnified view of each passband when setting the value of 8.2 nH for the inductor element in the filter circuit shown in FIG. 5(a) of the embodiment.
Figure 12:
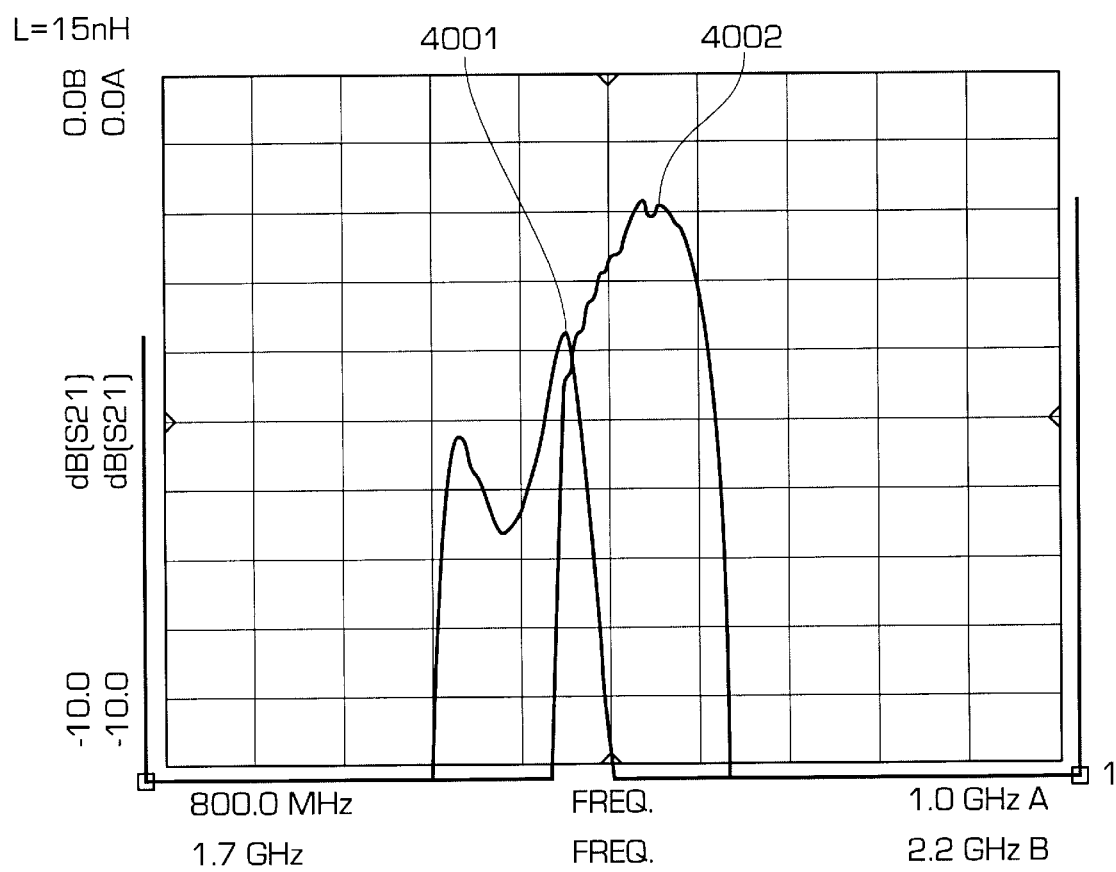
FIG. 12 is a partially magnified view of each passband when setting the value of 15 nH for the inductor element in the filter circuit shown in FIG. 5(a) of the embodiment.

When the value of the inductor is 8.2 nH, as shown in FIG. 11, it is known that the obtained characteristic is almost the same as the characteristic of each filter alone. When the inductor value is in a range of 4.7 nH to 15 nH, although the characteristic is inferior to that in FIG. 11, it is known that the filter is functioning in both bands of 900 MHz and 1.8 GHz (see FIG. 10, FIG. 12).

Figure 13:
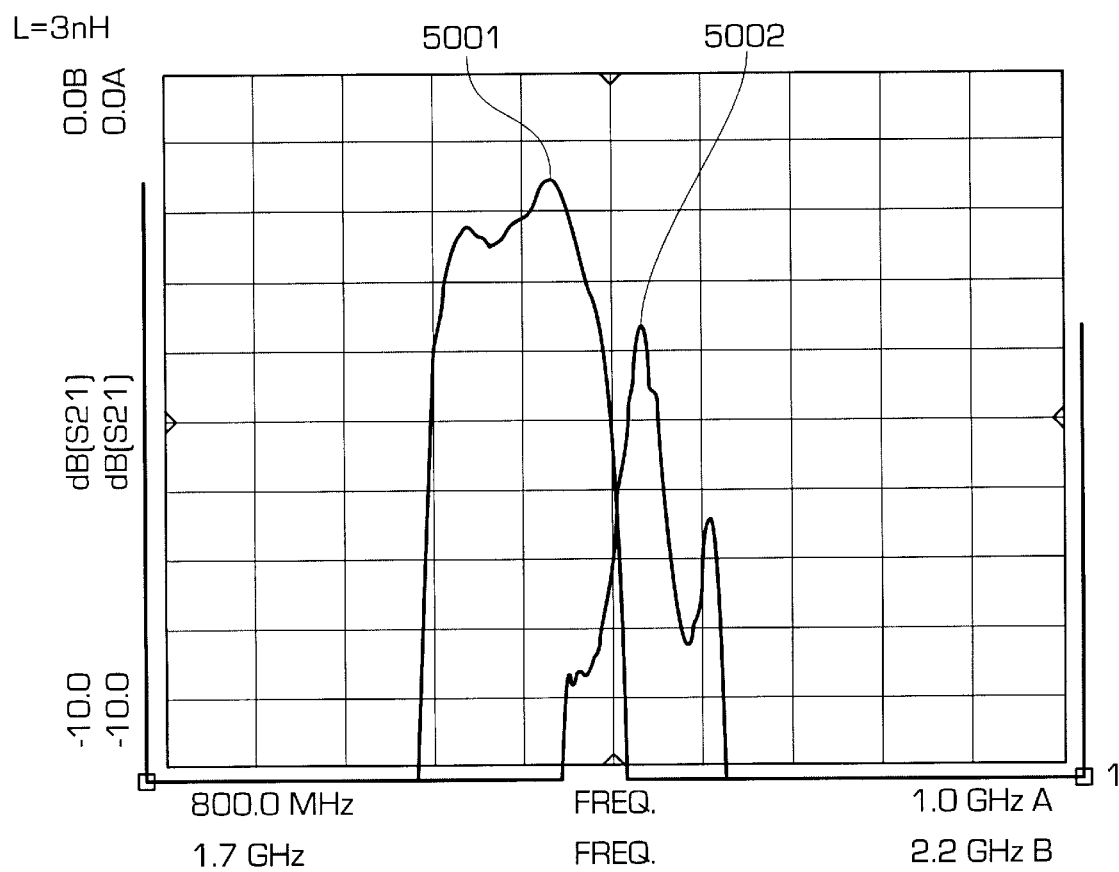
FIG. 13 is a partially magnified view of each passband when setting the value of 3 nH for the inductor element in the filter circuit shown in FIG. 5(a) of the embodiment.
Figure 14:
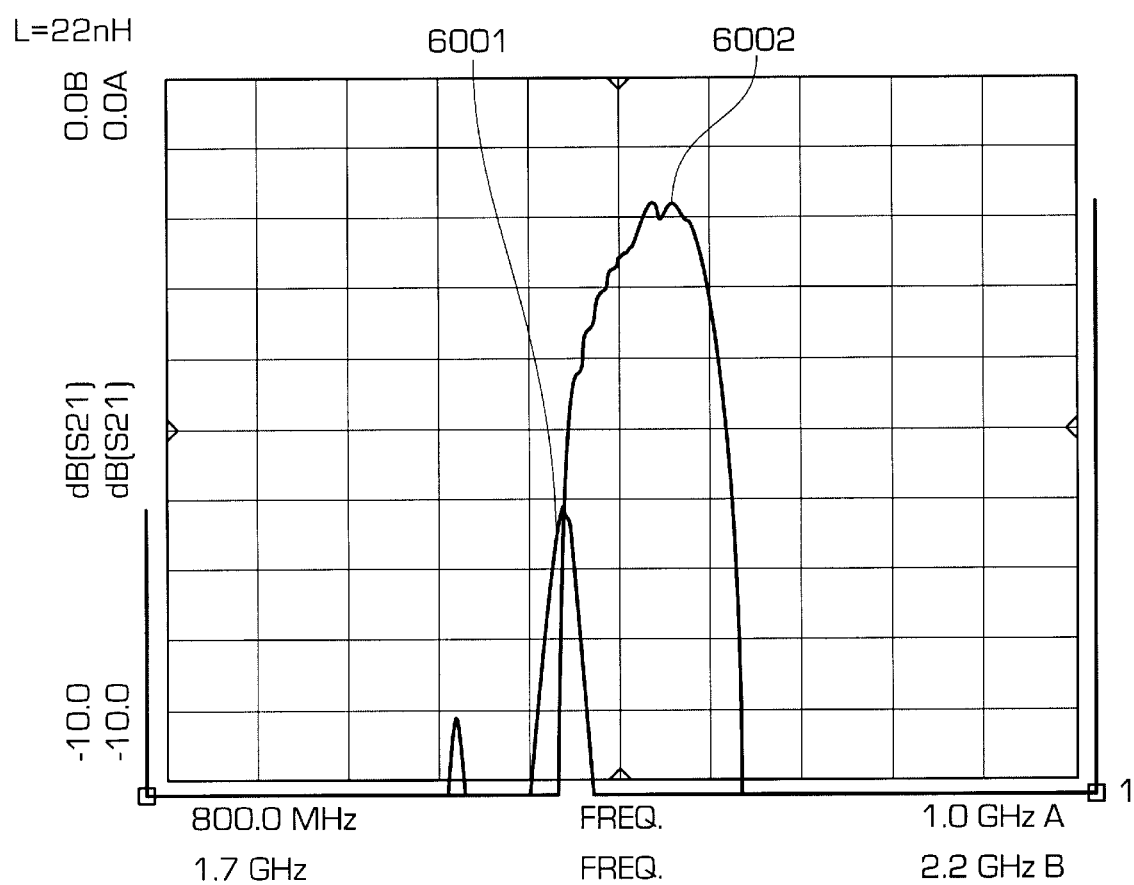
FIG. 14 is a partially magnified view of each passband when setting the value of 22 nH for the inductor element in the filter circuit shown in FIG. 5(a) of the embodiment.

When the value of the inductor is out of this range, as shown in FIG. 13 and FIG. 14, the characteristic deteriorates significantly to be far from a practical level. The inductor values are 3 nH and 22 nH respectively in FIG. 13 and FIG. 14. In each diagram, reference numerals 5001, 6001 are characteristic diagrams of the 900 MHz band of the filter 401, and 5002, 6002 are characteristic diagrams of the 1.8 GHz band of the filter 402.

As known from these characteristics, the inductor value should be smaller if the characteristic of the 900 MHz band is more important, and the inductor value should be larger if the characteristic of the 1.8 GHz band is more important. When the inductor value is small, the amounts moved from point A to point A' and from point B to point B' are small in FIG. 4(b), the inductor value in FIG. 8(b) becomes smaller, and the characteristic in the 900 MHz band is excellent, but the characteristic in the 1.8 GHz band deteriorates. To the contrary, when the inductor value is large, the amounts moved from point A to point A' and from point B to point B' are both large in FIG. 4(b), the inductor value in FIG. 8(b) becomes larger, and the characteristic in the 900 MHz band deteriorates, but the characteristic in the 1.8 GHz band is excellent.

Accordingly, the filter circuit having two passbands is realized in a constitution of a small number of matching elements.

Figure 15:
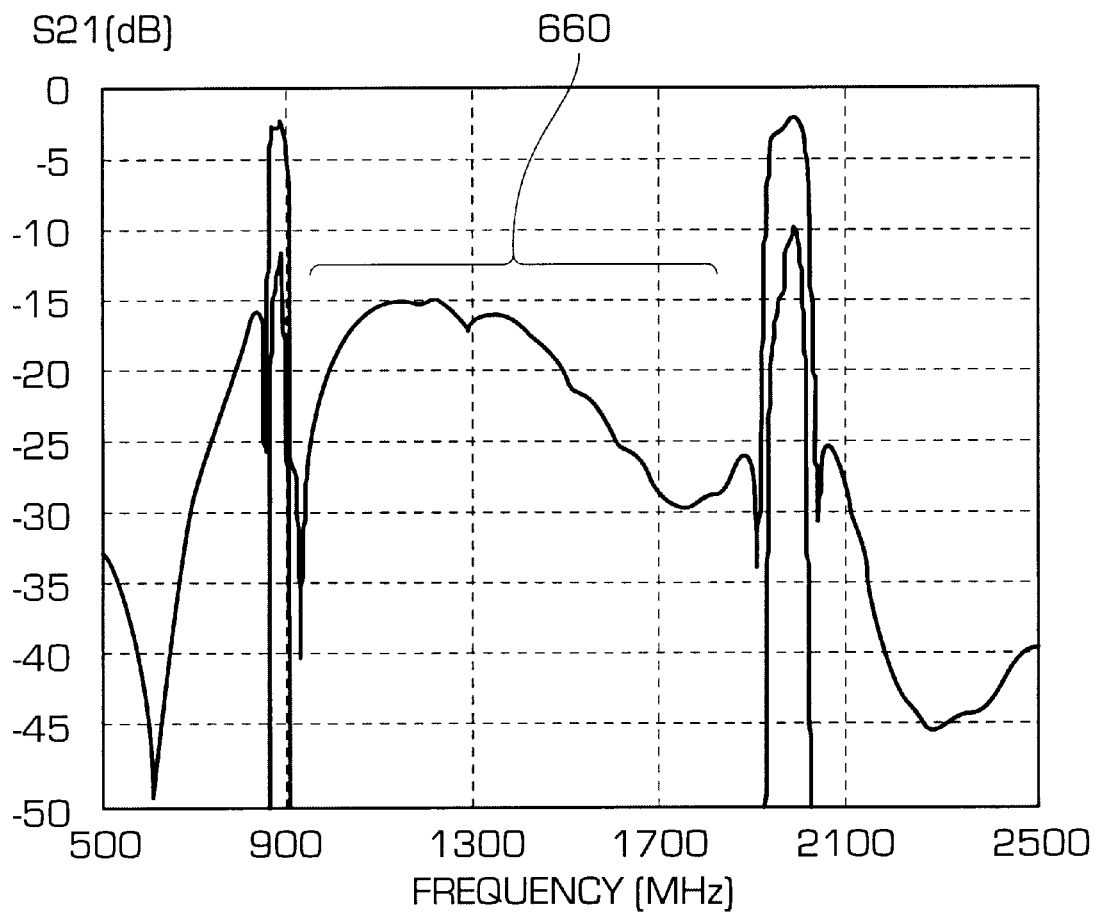
FIG. 15 is an overall view showing the passing characteristic of the filter circuit shown in FIG. 5(a).

FIG. 15 is an overall view showing the characteristics of the filter circuit shown in FIG. 5(a). As known from the diagram, according to this filter circuit, two signals of different frequencies can be passed simultaneously in one input signal.

(Embodiment 2)

Another embodiment of a filter circuit having plural passbands according to the invention is described below while referring to the accompanying drawings.

This circuit constitution further enhances the characteristic of the filter circuit stated in embodiment 1.

That is, in embodiment 1, it is known that the filter circuit having two passbands can be constituted. In this case, as mentioned above, the filter characteristic of the 900 MHz band and the characteristic of the 1.8 GHz band are in the relation of a trade-off.

Further, in the constitution of the filter circuit in embodiment 1, as mentioned above, the impedance of the filter in the passing center frequency contains the capacitive component or inductance component. Hence, the filter characteristic is not sufficient (see the filter characteristic 3002 of 1.8 GHz band shown in FIG. 11).

Figure 16:
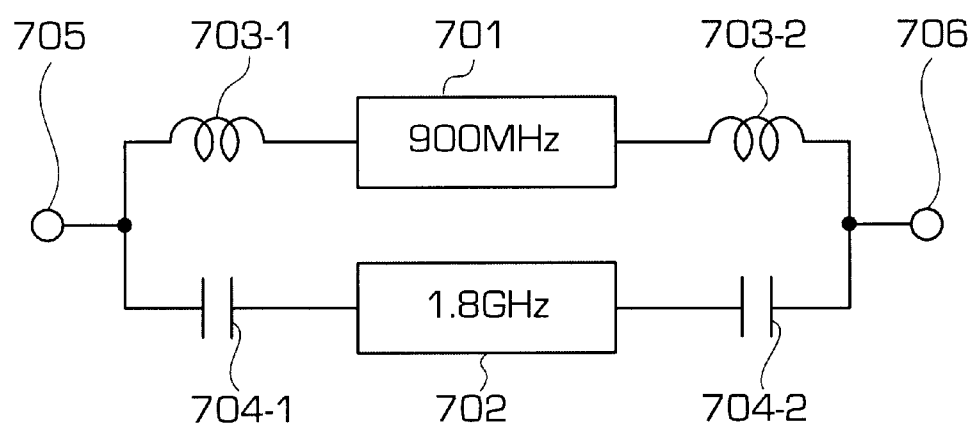
FIG. 16 is a diagram showing a filter circuit formed by parallel connection of a first filter and a second filter in embodiment 2.

In this embodiment, on the other hand, in order to further improve such filter characteristics, as shown in FIG. 16, an inductor was inserted in series with the first filter, and a capacitor in series with the second filter. That is, in the diagram, reference numeral 701 is a 900 MHz band filter, 702 is a 1.8 GHz band filter, 703 is a inductor element, 704 is a capacitor element, 705 is an input terminal, and 706 is an output terminal.

Its operation is described in detail below.

As explained in embodiment 1, the impedance characteristic of the 900 MHz band filter 701 and the impedance characteristic of the 1.8 GHz band filter 702 are as shown in FIG. 2 and FIG. 3. The impedances change when the inductor elements 703-1, 703-2 are connected in series to the 900 MHz filter 701 is as shown in FIG. 4(b). That is, the impedance in the passband of 900 MHz is moved from point A to point A', and the impedance of 1.8 GHz is moved from point B to point B'.

Figure 17A:
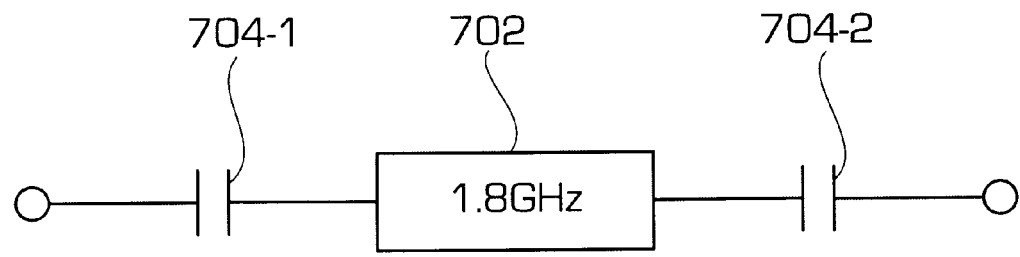
FIG. 17(a) is a circuit diagram formed by connection of capacitors 704-1, 704-2 in series to a 1.8 GHz band filter 702.
Figure 17B:
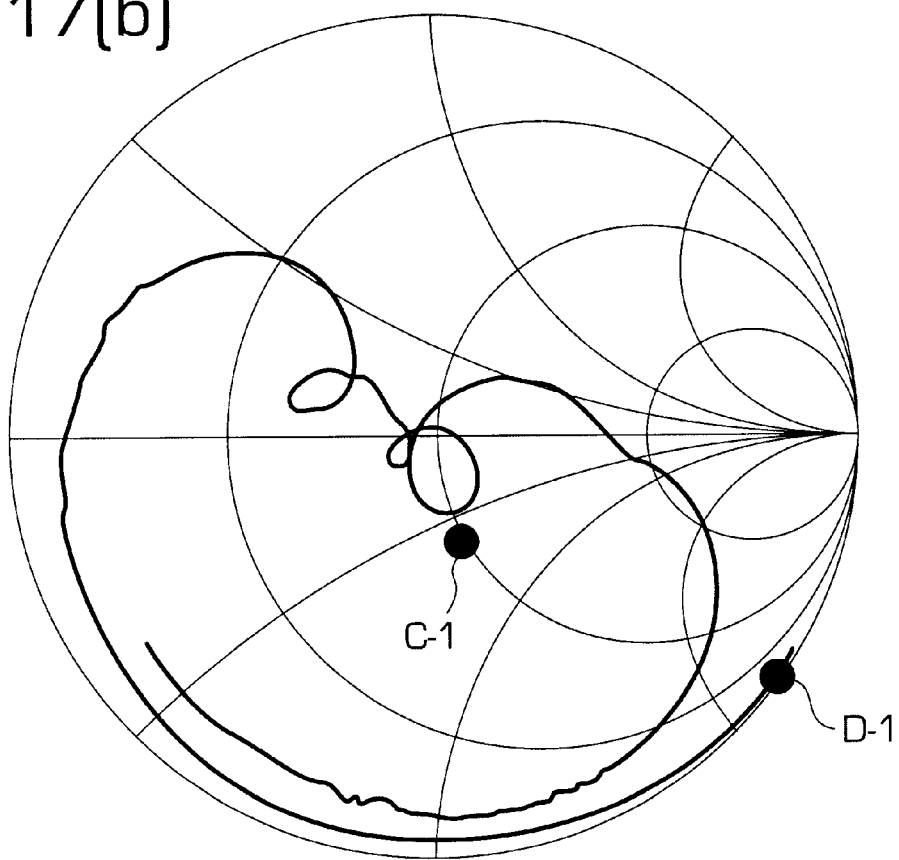
FIG. 17(b) is a diagram showing impedance changes of the circuit shown in FIG. 17(a).

Moreover, as shown in FIG. 17(a), when the capacitors 704-1, 704-2 are connected in series to the 1.8 GHz band filter 702, the impedance changes are as follows as seen on the basis of FIG. 3. That is, as shown in FIG. 17(b), the impedance in the 1.8 GHz band is moved from point C to point C-1, and the impedance in the 900 MHz band is moved from point D to point D-1.

Figure 18A:
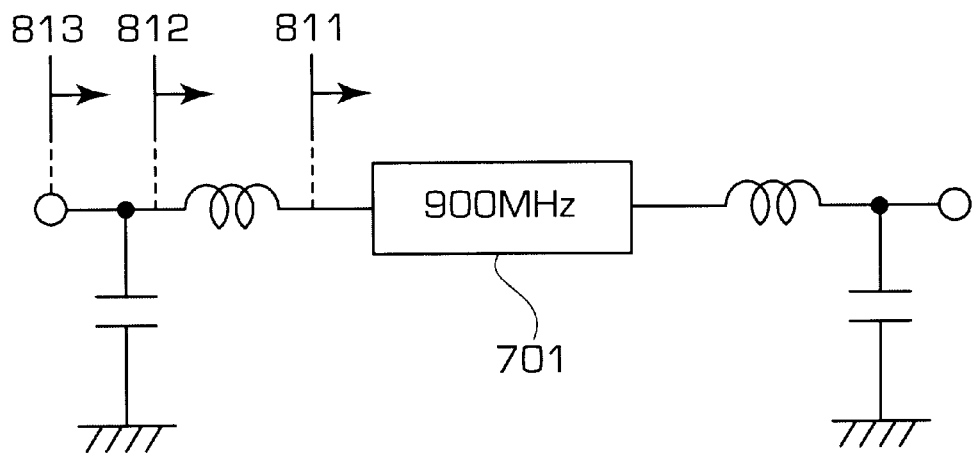
FIG. 18(a) is an equivalent circuit diagram in the 900 MHz band of the filter circuit shown in FIG. 16.
Figure 19A:
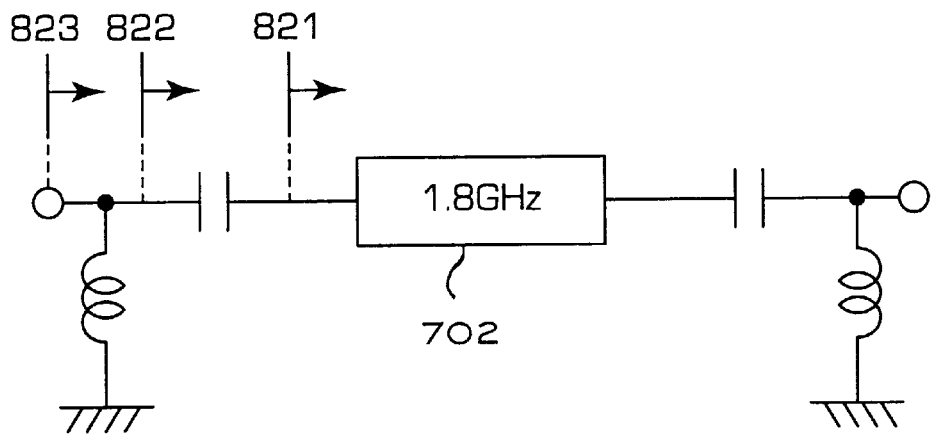
FIG. 19(a) is an equivalent circuit diagram in the 1.8 GHz band of the filter circuit shown in FIG. 16.

Equivalent circuits in the 900 MHz band and the 1.8 GHz band of the filter circuit shown in FIG. 16 may be estimated as shown in FIG. 18(a) and FIG. 19(a).

That is, the filter 702 in the filter circuit shown in FIG. 16 may be regarded as a capacitive element connected as shown in FIG. 18(a) in the 900 MHz band. Similarly, the filter 701 in the same filter circuit may be regarded as an inductor element connected as shown in FIG. 19(a) in the 1.8 GHz band. Smith charts for explaining the characteristics of the equivalent circuits shown in FIG. 18(a) and FIG. 19(a) are shown in FIG. 18(b), FIG. 19(b).

Herein, in the equivalent circuit shown in FIG. 18(a), the impedance in the 900 MHz band by observing the filter side from each position shown in the diagram (indicated by reference numerals 811, 812, 813) is sequentially described below.

Figure 18B:
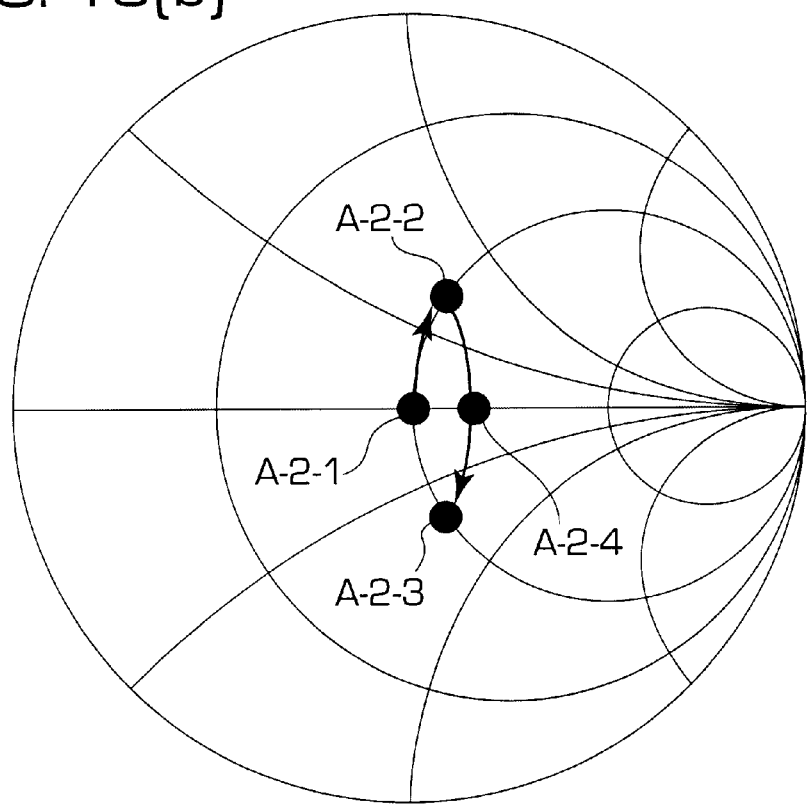
FIG. 18(b) is a Smith chart showing the characteristics of the equivalent circuit shown in FIG. 18(a).
Figure 19B:
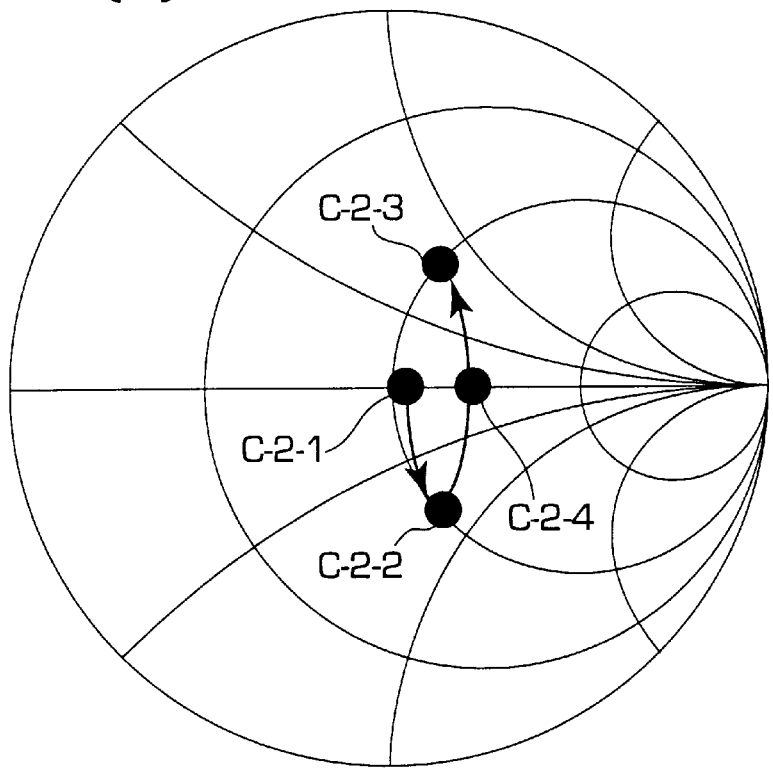
FIG. 19(b) is a Smith chart showing the characteristics of the equivalent circuit shown in FIG. 19(a).

First, the impedance of the filter 701 alone is nearly equivalent to the impedance as seen from the position 811 on the equivalent circuit shown in FIG. 18(a), and it can be expressed as point A-2-1 in FIG. 18(b). This is same as mentioned in FIG. 2.

When the circuit having the inductors 703-1, 703-2 connected to the filter 701 is seen from the input side, the impedance is nearly equivalent to the impedance as seen from the position 812 on the equivalent circuit in FIG. 18(a), and the point A-2-1 is moved to point A-2-2.

Further, when seen from the input side of the circuit connecting the capacitor elements 704-1, 704-2, the impedance is equivalent to the impedance as seen from the position 813 on the equivalent circuit in FIG. 18(a), and the point A-2-2 is moved to point A-2-3.

What determines the moving amount from point A-2-2 to point A-2-3 is the value of the capacitance against the ground in FIG. 18(a), that is, it is determined by the filter 702 of 1.8 GHz and the capacitive elements 704-1, 704-2.

On the other hand, the point A-2-4 shown in FIG. 18(b) is closest to the point A-2-1, and is known to be the position showing the optimum value.

Accordingly, by setting the values of the capacitive elements 704-1, 704-2 at proper values, the moving amount from point A-2-2 to point A-2-3 can be adjusted, and the optimum position of A-2-4 can be obtained. The review of values of capacitive elements is discussed later.

In the equivalent circuit shown in FIG. 19(a), when seeing the filter side from each position shown in the diagram (reference numerals 821, 822, 823), each impedance in the 1.8 GHz band is sequentially explained below in the same manner as above.

That is, in FIG. 19(a), the impedance in the 1.8 GHz band is point C-2-1 by because of the filter 702 alone, and by connecting capacitors, it is moved to point C-2-2, and further by connecting the 900 MHz filter 701, it is moved to point C-2-3.

In this case, what determines the moving amount from point C-2-2 to point C-2-3 is the value of the inductor against the ground in FIG. 19(a), that is, it is determined by the filter 701 of 900 MHz and the inductor elements 703-1, 703-2.

On the other hand, the point C-2-4 shown in FIG. 19(b) is closest to the point C-2-1, and is known to be the position showing the optimum value.

Accordingly, by setting the values of the inductor elements 703-1, 703-2 at proper values, the moving amount from point C-2-2 to point C-2-3 can be adjusted, and the optimum position of C-2-4 can be obtained.

Therefore, as a result of review of various values of the inductor elements 703-1, 703-2, and capacitive elements 704-1, 704-2 of the filter circuit shown in FIG. 16, as shown in FIG. 20 to FIG. 24, the usable range is found to be 4.7 nH to 15 nH for inductor values, and 2 pF to 8 pF for capacitive values.

Figure 24:
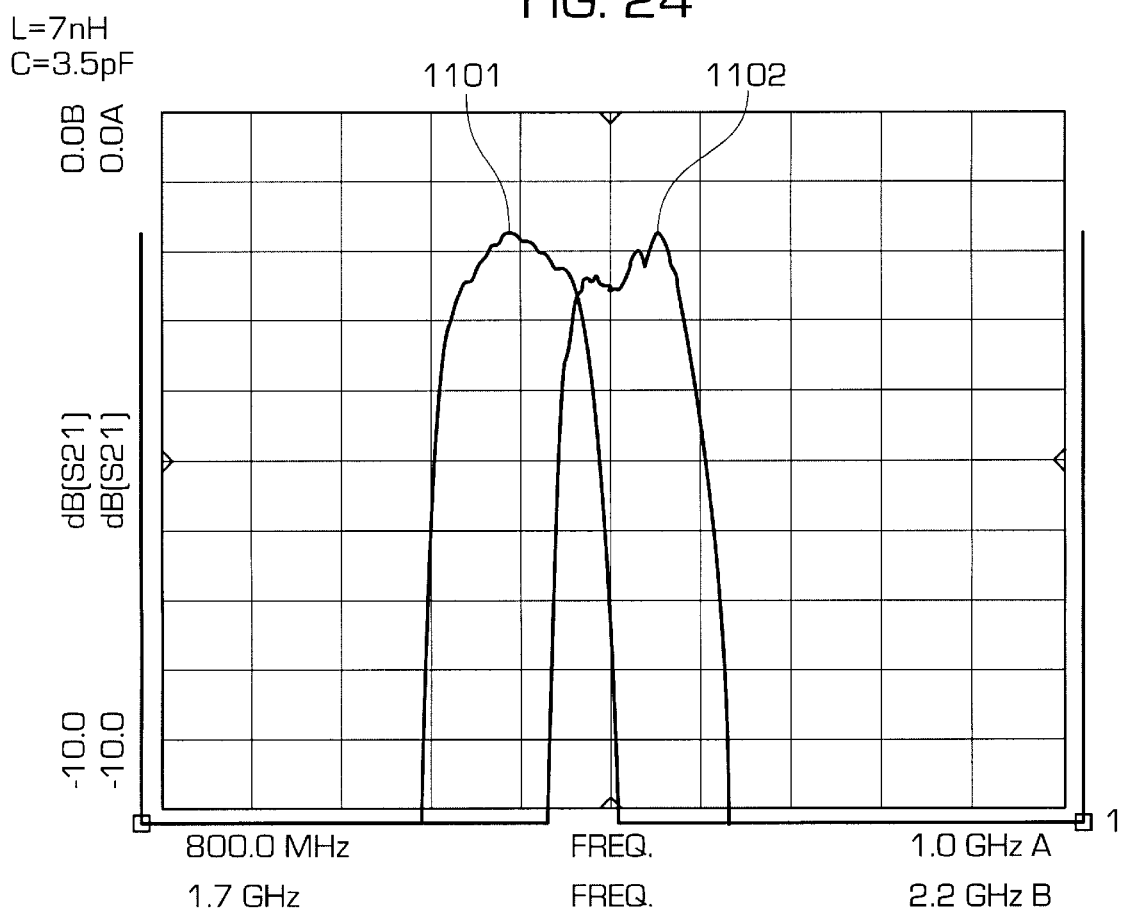
FIG. 24 is a partially magnified view of each passband when setting the value of 7 nH for the inductor element, and 3.5 pF for the capacitor element, in the filter circuit shown in FIG. 16 of the embodiment.

Herein, FIG. 20 is a diagram showing the filter characteristics when the inductor element value is 4.7 nH and the capacitive element value is 2 pF. FIG. 21 is a diagram showing the filter characteristics when the inductor element value is 4.7 nH and the capacitive element value is 8 pF. FIG. 22 is a diagram showing the filter characteristics when the inductor element value is 15 nH and the capacitive element value is 2 pF. FIG. 23 is a diagram showing the filter characteristics when the inductor element value is 15 nH and the capacitive element value is 8 pF. FIG. 24 is a diagram showing the filter characteristics when the inductor element value is 7 nH and the capacitive element value is 3.5 pF. In these diagrams, curves indicated by reference numerals 7001, 8001, 9001, 1011, 1101 are characteristic diagrams of the 900 MHz band of the filter circuit in FIG. 16, and curves indicated by reference numerals 7002, 8002, 9002, 1012, 1102 are characteristic diagrams of the 1.8 GHz band of the same filter.

It is hence known that the optimum condition for the filter characteristics occur when the inductor element value is 7 nH and the capacitive element value is 3.5 pF (see FIG. 24).

It is known as follows by comparing FIG. 11 and FIG. 24.

That is, the characteristics of the 900 MHz band of the filter circuit in FIG. 16 (reference numeral 1101 in FIG. 24) is not so much different from the characteristics of the filter circuit in FIG. 5(a) (reference numeral 3001 in FIG. 11). However, the characteristics of the 1.8 GHz band of the filter circuit in FIG. 16 (reference numeral 1102 in FIG. 24) is, as compared with the characteristics of the filter circuit in FIG. 5(a) (reference numeral 3002 in FIG. 11), expanded in the width of the passband, and is enhanced in performance.

On the other hand, as known also from FIG. 20 to FIG. 23, when the inductor value is 4.7 nH or 15 nH, or when the capacitive element value is 2 pF or 8 pF, although the filter characteristics are inferior to that in FIG. 24, it is known that the filter is functioning in both the 900 MHz band and the 1.8 GHz band. If out of this range, the characteristics deteriorate significantly, and the characteristics are no longer practicable.

As known by observing such filter characteristics, the inductor or capacitor value should be small when the 900 MHz band characteristic is more important, and the inductor or capacitor value should be large when the 1.8 GHz band characteristic is more important.

That is, when the inductor or capacitor value is small, in the Smith chart shown in FIG. 18(b), the moving amount from point A-2-1 to A-2-2 is small, and the inductor value in FIG. 19(a), FIG. 19(b) is small, and the 900 MHz characteristic is excellent, but the 1.8 GHz characteristic is inferior.

To the contrary, when the inductor or capacitor value is large, in the Smith chart shown in FIG. 18(b), the moving amount from point A-2-1 to A-2-2 is large, and the capacitor value in FIG. 18(a), FIG. 18(b) is not appropriate, and the 900 MHz characteristic is inferior, but the 1.8 GHz characteristic is excellent.

Hence, the following is known.

That is, when two filters are connected as shown in FIG. 16, in the passband of one filter, the impedance of the other filter is not infinite. Accordingly, the impedance of the other filter is regarded as if a certain circuit element were connected. Considering the apparent characteristic of this circuit element, by adjusting the values of the circuit elements connected to the other filter (in FIG. 16, inductor elements 703-1, 703-2, or capacity elements 704-1, 704-2), if the impedance of the other filter is not infinite, the filter circuit exhibiting the filter characteristics the same as in the prior art can be constituted by a smaller number of elements.

Figure 26:
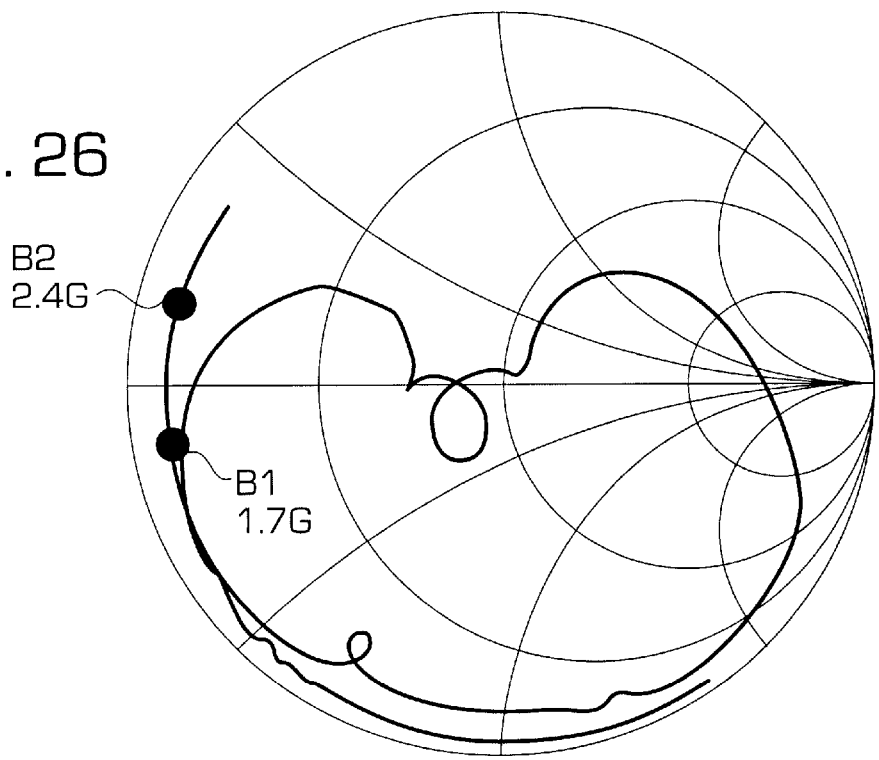
FIG. 26 is a comparative diagram of impedances in the 2.4 GHz band and the 1.7 GHz band of a first filter when the passing frequency range of the first filter is changed from the 800 MHz band to 900 MHz band.
Figure 27:
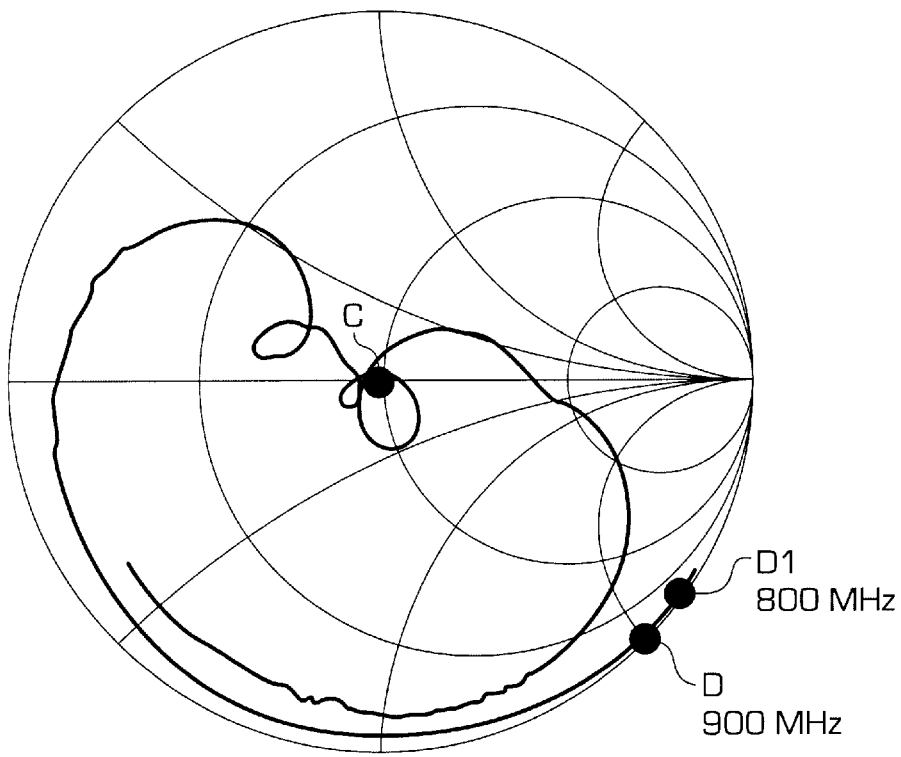
FIG. 27 is a comparative diagram of impedances in the 800 MHz band and the 900 MHz band of a second filter when the passing frequency range of the second filter is changed from the 1.7 GHz band to the 2.4 GHz band.

Also, as shown in FIG. 26 and FIG. 27, if the passing frequency range of each filter is changed from the 800 MHz band to the 900 MHz band, or from the 1.7 GHz band to the 2.4 GHz band, it is known that the impedance is not changed so much. Therefore, if the passing frequency of the filter changes in this range, the above description can be directly applied. FIG. 26 is a diagram showing the impedance of the first filter in the 2.4 GHz band (indicated by point B2 in the diagram) by changing the passing frequency range of the first filter from the 800 MHz band to the 900 MHz band, and changing the passing frequency band of the second filter from the 1.7 GHz band to the 2.4 GHz band. In the diagram, by way of comparison, the impedance in the 1.7 GHz band is also shown (indicated by point B1). FIG. 27 is a diagram showing the impedance of the second filter in the 800 MHz band (indicated by point D1). In the diagram, by way of comparison, the impedance in the 900 MHz band is also shown (indicated by point D).

Figure 25:
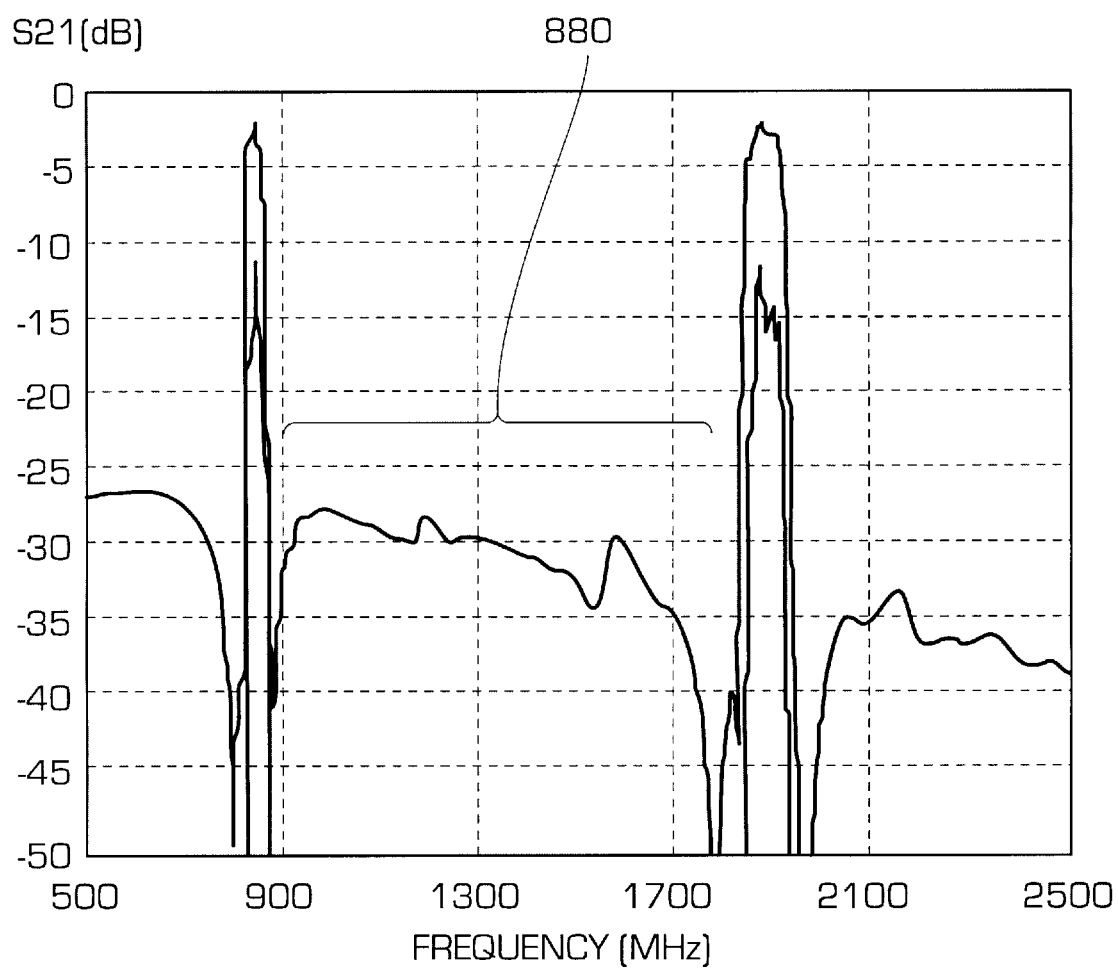
FIG. 25 is an overall view showing the passing characteristics of the filter circuit shown in FIG. 16.

FIG. 25 is an overall view showing the characteristics of the filter circuit shown in FIG. 16. As known also from this diagram the, same as in embodiment 1, according to this filter circuit, for one input signal, two signals of different frequencies can be passed simultaneously.

According to the characteristic diagram shown in FIG. 15 relating to embodiment 1, a hump 660 is found between two passing frequencies. By contrast, in the characteristic diagram of FIG. 25 of this embodiment, the corresponding portion 880 between the two passing frequencies is relatively flat. Such a hump 660 as shown in FIG. 15 is not preferable for most system configurations, and this point is improved in the filter circuit in this embodiment.

In the embodiment, the filter circuit of one input and one output is composed, but the invention is not limited to this. The circuit may be composed of, for example, one input and two outputs, or two inputs and one output. By inserting matching elements into connection points where mutual filters are connected, the filter circuit having different passing frequency bands can be realized by a small number of elements the same as in the foregoing embodiments.

In this embodiment, an example using a ladder type surface acoustic wave filter is explained, but the invention is not limited to this. For example, the invention may be similarly applied to the so-called longitudinal mode filter which has the same impedance as in the embodiments above. By the constitution of the ladder filter, the impedance outside of the band is not so much changed, in particular, and it may be similarly applied if the constitution is different.

Not only with the surface acoustic wave filter but also with the dielectric filter, the invention may be similarly applied as far as the frequency relation and impedance relation are the same as in the embodiments above.

In the embodiments above external parts are used as inductors and capacitors, but the invention is this. These not limited to parts can be internally composed. That is, for example, capacitor elements or inductor elements can be formed on a piezoelectric substrate of a surface acoustic wave filter or in a package accommodating the piezoelectric substrate. Of course, the first filter and the second filter may be contained in a same package.

In the embodiments for the first filter and the second filter, the following case is also mentioned. That is, a filter may be used in which the input and output impedance of each passing frequency of the two filters individually is matched with the input and output impedance demanded in the filter circuit composed by connecting these filters. Not limited to this, for example, it may be also possible to use a filter for which the input and output impedance of the first filter alone and/or the second filter alone is lower than the input and output impedance required in the filter circuit.

For example, as mentioned in the explanation of embodiment 2, in the case of the filter circuit connecting an inductor in series to the first filter, connecting a capacitor in series to the second filter, and connecting both of the filters in parallel (see FIG. 16), the input and output impedance in the 900 MHz band and the 1.8 GHz band are as shown in FIG. 18(b) and FIG. 19(b). As known from these diagrams, the impedance at the optimum matching point of the input and output impedance of the filter circuit shown in FIG. 16 (see point A-2-4 in FIG. 18(b), and point C-2-4 in FIG. 19(b)) is higher than the input and output impedance of the filters 701, 702 alone (see point A-2-1 in FIG. 18(b), and point C-2-1 in FIG. 19(b)). Therefore, by preliminarily considering such moving characteristics of the optimum matching point by connecting the two filters, it may be constituted to use filters 701, 702 in which the input and output impedances of the filters 701, 702 alone are set lower than the input and output impedance required in the filter circuit. In such a constitution, although the input and output impedances of the filters alone are not the required value, the input and output impedances of the finally composed filter circuit coincides with the required value or may be set closer to the required value.

Thus, according to the invention, the number of matching elements is further curtailed.

What is claimed is:

1. A filter circuit having plural passbands, comprising:
   a first filter having a first passband,
   a second filter having a second passband higher than the first passband, the first filter being connected with the second filter such that at least one input terminal and one output terminal of the first filter is connected in parallel with at least one input terminal and one output terminal of the second filter, and
   an inductor element connected in series to a terminal of the first filter that is connected to a terminal of the second filter,
   wherein, when a connection point of the first filter and the second filter is severed, an input impedance of the second filter in the passband of the first filter is not present in a range substantially regarded to be infinite, and an input impedance of the first filter in the passband of the second filter is not present in a range substantially regarded to be infinite.

2. A filter circuit as recited in claim 1, wherein a capacitor element is connected in series to a terminal of the second filter that is connected to a terminal of the first filter.

3. A filter circuit as recited in claim 2, wherein input and output impedances of the first filter alone or input and output impedances of the second filter alone are lower than input and output impedances for the filter circuit.

4. A filter circuit as recited in claim 2, wherein the first filter and the second filter are surface acoustic wave filters.

5. A filter circuit as recited in claim 4, wherein the first filter and the second filter are surface acoustic wave filters, and are contained in a same package.

6. A filter circuit as recited in claim 4, wherein the inductor element is formed on a piezoelectric substrate of one of the surface acoustic wave filters or in a package accommodating the piezoelectric substrate.

7. A filter circuit as recited in claim 2, wherein a passing center frequency of the first filter is 800 MHz or 900 MHz, and a passing center frequency of the second filter is any frequency from 1.7 GHz to 2.4 GHz, and
   an inductance value of the inductor element connected in series to the first filter is any value ranging from 4.7 nH to 15 nH, and a capacitance value of the capacitor element connected in series to the second filter is any value ranging from 2 pF to 8 pF.

8. A filter circuit as recited in claim 7, wherein the first filter and the second filter are surface acoustic wave filters, and are contained in a same package.

9. A filter circuit as recited in claim 7, wherein
   at least one of the first filter and the second filter is a surface acoustic wave filter, and
   the capacitor element or the inductor element is formed on a piezoelectric substrate of the surface acoustic wave filter or in a package accommodating the piezoelectric substrate.

10. A filter circuit as recited in claim 2, wherein the first filter and the second filter are surface acoustic wave filters, and are contained in a same package.

11. A filter circuit as recited in claim 2, wherein
    at least one of the first filter and the second filter is a surface acoustic wave filter, and
    the capacitor element or the inductor element is formed on a piezoelectric substrate of the surface acoustic wave filter or in a package accommodating the piezoelectric substrate.

12. A filter circuit as recited in claim 1, wherein a passing center frequency of the first filter is 800 MHz or 900 MHz, and a passing center frequency of the second filter is any frequency from 1.7 GHz to 2.4 GHz, and
    an inductance value of the inductor element connected in series to the first filter is any value ranging from 4.7 nH to 15 nH.

13. A filter circuit as recited in claim 12, wherein the first filter and the second filter are surface acoustic wave filters, and are contained in a same package.

14. A filter circuit as recited in claim 12, wherein
    at least one of the first filter and the second filter is a surface acoustic wave filter, and
    the inductor element is formed on a piezoelectric substrate of the surface acoustic wave filter or in a package accommodating the piezoelectric substrate.

15. A filter circuit as recited in claim 1, wherein the first filter and the second filter are surface acoustic wave filters.

16. A filter circuit as recited in claim 15, wherein the inductor element is formed on a piezoelectric substrate of one of the surface acoustic wave filters or in a package accommodating the piezoelectric substrate.

17. A filter circuit as recited in claim 15, wherein the first filter and the second filter are surface acoustic wave filters, and are contained in a same package.

18. A filter circuit as recited in claim 1, wherein the first filter and the second filter are surface acoustic wave filters, and are contained in a same package.

19. A filter circuit as recited in claim 1, wherein
    at least one of the first filter and the second filter is a surface acoustic wave filter, and
    the inductor element is formed on a piezoelectric substrate of the surface acoustic wave filter or in a package accommodating the piezoelectric substrate.

20. A filter circuit as recited in claim 1, wherein input and output impedances of the first filter alone or input and output impedances of the second filter alone are lower than input and output impedances of the filter circuit.

21. A filter circuit having plural passbands, comprising:
    a first filter having a first passband with a passing center frequency of 800 MHz or 900 MHz,
    a second filter having a second passband with a passing center frequency of any frequency from 1.7 GHz to 2.4 GHz, the first filter being connected with the second filter such that at least one input terminal and one output terminal of the first filter is connected in parallel with at least one input terminal and one output terminal of the second filter, and
    an inductor element connected in series to a terminal of the first filter that is connected to a terminal of the second filter, the inductor element having an inductance value ranging from 4.7 nH to 15 nH.

22. A filter circuit as recited in claim 21, wherein input and output impedances of the first filter alone or input and output impedances of the second filter alone are lower than input and output impedances of the filter circuit.

23. A filter circuit as recited in claim 21, wherein the first filter and the second filter are surface acoustic wave filters, and are contained in a same package.

24. A filter circuit as recited in claim 21, wherein at least one of the first filter and the second filter is a surface acoustic wave filter, and the inductor element is formed on a piezoelectric substrate of the surface acoustic wave filter or in a package accommodating the piezoelectric substrate.

25. A filter circuit having plural passbands, comprising:

a first filter having a first passband with a passing center frequency of 800 MHz or 900 MHz, a second filter having a second passband with a passing center frequency of any frequency from 1.7 GHz to 2.4 GHz, the first filter being connected with the second filter such that at least one input terminal and one output terminal of the first filter is connected in parallel with at least one input terminal and one output terminal of the second filter, an inductor element connected in series to a terminal of the first filter that is connected to a terminal of the second filter, the inductor element having an inductance value ranging from 4.7 nH to 15 nH; and a capacitor element connected in series to a terminal of the second filter that is connected to a terminal of the first filter, the capacitor element having a capacitance value ranging from 2 pF to 8 pF.

26. A filter circuit as recited in claim 25, wherein the first filter and the second filter are surface acoustic wave filters, and are contained in a same package.

27. A filter circuit as recited in claim 25, wherein at least one of the first filter and the second filter is a surface acoustic wave filter, and the capacitor element or the inductor element is formed on a piezoelectric substrate of the surface acoustic wave filter or in a package accommodating the piezoelectric substrate.

28. A filter circuit as recited in claim 25, wherein input and output impedances of the first filter alone or input and output impedances of the second filter alone are lower than input and output impedances for the filter circuit.

* * * * *